United States Patent
Park et al.

(10) Patent No.: US 11,810,957 B2
(45) Date of Patent: Nov. 7, 2023

(54) SEMICONDUCTOR DEVICE

(71) Applicant: Samsung Electronics Co., Ltd., Suwon-si (KR)

(72) Inventors: Juhun Park, Seoul (KR); Deokhan Bae, Suwon-si (KR); Jin-Wook Kim, Hwaseong-si (KR); Yuri Lee, Hwaseong-si (KR); Inyeal Lee, Seongnam-si (KR); Yoonyoung Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 17/469,361

(22) Filed: Sep. 8, 2021

(65) Prior Publication Data

US 2022/0157955 A1    May 19, 2022

(30) Foreign Application Priority Data

Nov. 16, 2020 (KR) .................. 10-2020-0152926

(51) Int. Cl.
| | |
|---|---|
| *H01L 29/417* | (2006.01) |
| *H01L 27/092* | (2006.01) |
| *H01L 21/8238* | (2006.01) |

(52) U.S. Cl.
CPC .......... *H01L 29/41775* (2013.01); *H01L 21/823814* (2013.01); *H01L 21/823821* (2013.01); *H01L 21/823878* (2013.01); *H01L 27/0924* (2013.01)

(58) Field of Classification Search
CPC ....... H01L 29/41775; H01L 21/823814; H01L 21/823821; H01L 21/823878; H01L 27/0924; H01L 21/76895; H01L 21/76883; H01L 21/76897; H01L 23/485; H01L 23/5283; H01L 21/823828;
(Continued)

(56) References Cited

U.S. PATENT DOCUMENTS

| | | |
|---|---|---|
| 9,773,879 B2 | 9/2017 | Huang et al. |
| 10,504,791 B2 | 12/2019 | Liou et al. |

(Continued)

FOREIGN PATENT DOCUMENTS

| | | |
|---|---|---|
| KR | 2020-0026404 A | 3/2020 |
| KR | 2021/0120718 A | 10/2021 |

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

Disclosed is a semiconductor device including a substrate including first and second active regions, a device isolation layer on the substrate and defining first and second active patterns, first and second gate electrodes running across the first and second active regions and aligned with each other, first and second source/drain patterns on the first and second active patterns, a first active contact connecting the first and second source/drain patterns to each other, and a gate cutting pattern between the first and second gate electrodes. An upper portion of the first active contact includes first and second upper dielectric patterns. The first active contact has a minimum width at a portion between the first and second upper dielectric patterns. A minimum width of the gate cutting pattern is a second width. A ratio of the first width to the second width is in a range of 0.8 to 1.2.

20 Claims, 37 Drawing Sheets

(58) Field of Classification Search
CPC ....... H01L 21/823871; H01L 29/41791; H01L 27/092; H01L 21/823807; H01L 29/785; H01L 29/78696
See application file for complete search history.

(56) References Cited

U.S. PATENT DOCUMENTS

| | | | |
|---|---|---|---|
| 10,593,671 B2 | 3/2020 | Bae et al. | |
| 2016/0284700 A1* | 9/2016 | Yoon | H01L 27/1211 |
| 2016/0308008 A1* | 10/2016 | Yeo | H01L 29/66795 |
| 2018/0182845 A1* | 6/2018 | Seong | H01L 21/823871 |
| 2018/0358345 A1* | 12/2018 | Qian | H01L 27/0207 |
| 2019/0013314 A1* | 1/2019 | Choi | H01L 23/5226 |
| 2019/0252376 A1* | 8/2019 | Kim | H01L 29/78 |
| 2019/0268000 A1* | 8/2019 | Song | H01L 27/0886 |
| 2019/0280087 A1* | 9/2019 | Park | H01L 27/0886 |
| 2020/0074044 A1 | 3/2020 | Peng et al. | |
| 2020/0075421 A1* | 3/2020 | Wu | H01L 23/485 |
| 2020/0075595 A1 | 3/2020 | Shin et al. | |
| 2020/0119000 A1 | 4/2020 | Wang et al. | |
| 2020/0135473 A1 | 4/2020 | Park et al. | |
| 2021/0305427 A1 | 9/2021 | Bae et al. | |

* cited by examiner

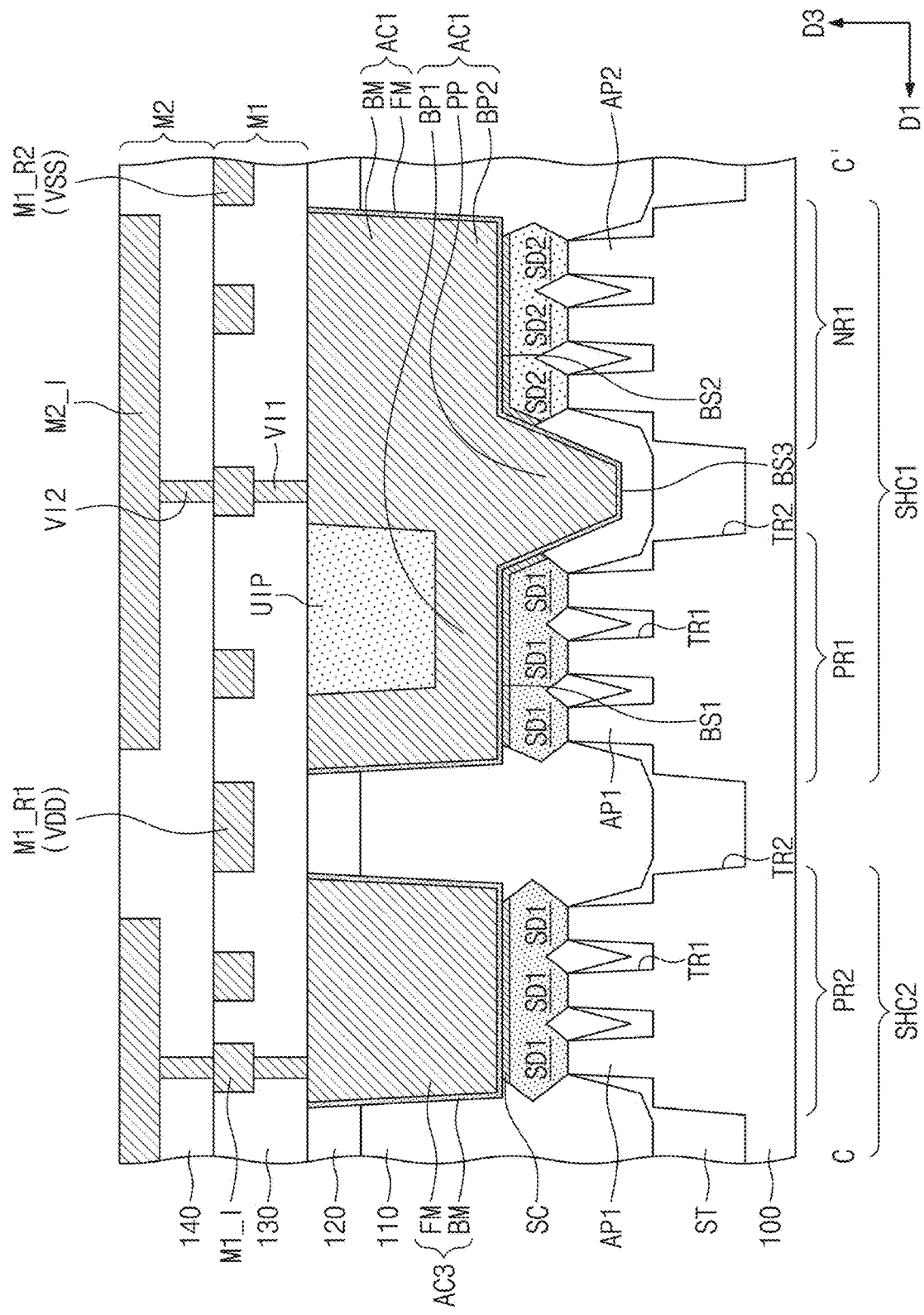

SEMICONDUCTOR DEVICE

CROSS-REFERENCE TO RELATED APPLICATION

This U.S. nonprovisional application claims priority under 35 U.S.C § 119 to Korean Patent Application No. 10-2020-0152926, filed on Nov. 16, 2020 in the Korean Intellectual Property Office, the disclosure of which is hereby incorporated by reference in its entirety.

BACKGROUND

Inventive concepts relate to a semiconductor device, and more particularly, to a semiconductor device including a field effect transistor.

Semiconductor devices have been widely used in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually becoming more complicated and more integrated to meet these requested characteristics.

SUMMARY

Some example embodiments of inventive concepts provide a semiconductor device including a field effect transistor with enhanced electrical characteristics.

According to some example embodiments of inventive concepts, a semiconductor device may include a substrate including a first active region and a second active region that are spaced apart from each other in a first direction; a device isolation layer on the substrate, the device isolation layer defining a first active pattern on the first active region and a second active pattern on the second active region; a first gate electrode and a second gate electrode that run across the first active region and the second active region, the first gate electrode and the second gate electrode being aligned with each other in the first direction; a first source/drain pattern and a second source/drain pattern on each of the first active pattern and the second active pattern; a first active contact that extends in the first direction and connects the first source/drain pattern and the second source/drain pattern to each other; and a gate cutting pattern between the first gate electrode and the second gate electrode. An upper portion of the first active contact may include a first upper dielectric pattern on the first active region and a second upper dielectric pattern on the second active region. A minimum width at a portion of the first active contact may be a first width. The portion of the first active contact may be between the first upper dielectric pattern and the second upper dielectric pattern. A minimum width of the gate cutting pattern may be a second width. A ratio of the first width to the second width may be in a range of about 0.8 to about 1.2.

According to some example embodiments of inventive concepts, a semiconductor device may include a substrate including a first active region of a first logic cell and a second active region of a second logic cell, the first logic cell and the second logic cell being adjacent to each other in a first direction on the substrate; a first gate electrode and a second gate electrode that run across the first active region and the second active region; a gate cutting pattern between the first gate electrode and the second gate electrode; and an active contact that extends from the first active region toward the second active region. The active contact may include a first upper dielectric pattern, a protrusion, and a second upper dielectric pattern. The first upper dielectric pattern and the second upper dielectric pattern may be on an upper portion of the active contact and spaced apart from each other in the first direction. The protrusion may be on a device isolation layer between the first active region and the second active region. The protrusion may protrude toward the device isolation layer. The first upper dielectric pattern and the second upper dielectric patterns may be horizontally offset from the protrusion.

According to some example embodiments of inventive concepts, a semiconductor device may include a substrate including a first active region of a first logic cell and a second active region of a second logic cell. The first logic cell and the second logic cell may be adjacent to each other in a first direction on the substrate. Each of the first logic cell and the second logic cell may include a first boundary, a second boundary, a third boundary, and a fourth boundary. The first boundary and the second boundary may be opposite to each other in a second direction that intersects the first direction. The third boundary and the fourth boundary may be opposite to each other in the first direction. The first active region and the second active region may be spaced apart from each other in the first direction. The first active region may be one of a PMOSFET region and an NMOSFET region, The second active region may be an other of PMOSFET region and the NMOSFET region. The semiconductor device may further include a device isolation layer on the substrate, the device isolation layer defining a first active pattern on the first active region and a second active pattern on the second active region, the first active pattern and the second active pattern extending in the second direction, and an upper portion of the first active pattern and an upper portion of the second active pattern protruding upwardly from the device isolation layer; a first gate electrode that runs across the first active pattern and the second active pattern on the first logic cell and extends in the first direction; a second gate electrode that runs across the first active pattern and the second active pattern on the second logic cell, the first gate electrode and the second gate electrode being aligned with each other in the first direction; a gate cutting pattern between the first gate electrode and the second gate electrode; a first source/drain pattern and a second source/drain pattern on the upper portion of the first active pattern and the upper portion of the second active pattern, respectively; a separation structure on at least one of the first boundary and the second boundary; a gate spacer on at least one sidewall of the first gate electrode and at least one sidewall of the second gate electrode; a gate capping pattern on a top surface of the first gate electrode and a top surface of the second gate electrode; an interlayer dielectric layer on the gate capping pattern; an active contact that penetrates the interlayer dielectric layer and couples to at least one of the first source/drain pattern and the second source/drain pattern; a silicide pattern between the active contact and each of the first source/drain pattern and the second source/drain pattern; a gate contact that penetrates the interlayer dielectric layer and the gate capping pattern, the gate contact being coupled to at least one of the first gate electrode and the second gate electrode; a first metal layer on the interlayer dielectric layer, the first metal layer including a power line on one of the third boundary and the fourth boundary, the power line extending in the second direction and having an electrical connection with the active contact; and a second metal layer on the first metal layer. The active contact may extend from the first active region on the first logic cell toward the first active region on the second logic cell. An upper portion of the active contact may include a first upper dielectric pattern on the first active region on the first logic cell and a second upper dielectric pattern on the first active region on the second logic cell. A minimum width at a portion of the active contact may be a first width. The portion of the active contact may be between the first upper dielectric pattern and the second upper dielectric pattern. A minimum width of the gate cutting pattern may be a second width. A ratio of the first width to the second width may be in a range of about 0.8 to about 1.2.

BRIEF DESCRIPTION OF THE DRAWINGS

FIGS. 5A, 5B, 5C, 5D, and 5E illustrate cross-sectional views respectively taken along lines A-A', B-B', C-C', D-D', and E-E' of FIG. 4.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
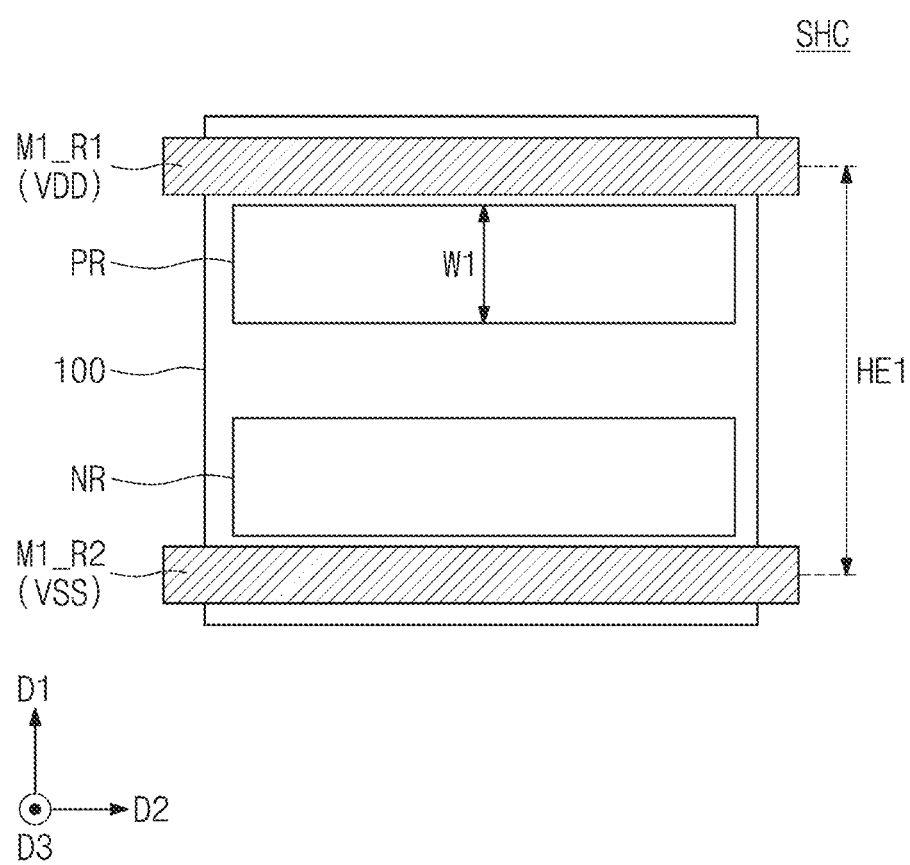
FIGS. 1 to 3 illustrate conceptual diagrams showing logic cells of a semiconductor device according to some example embodiments of inventive concepts.
Figure 2:
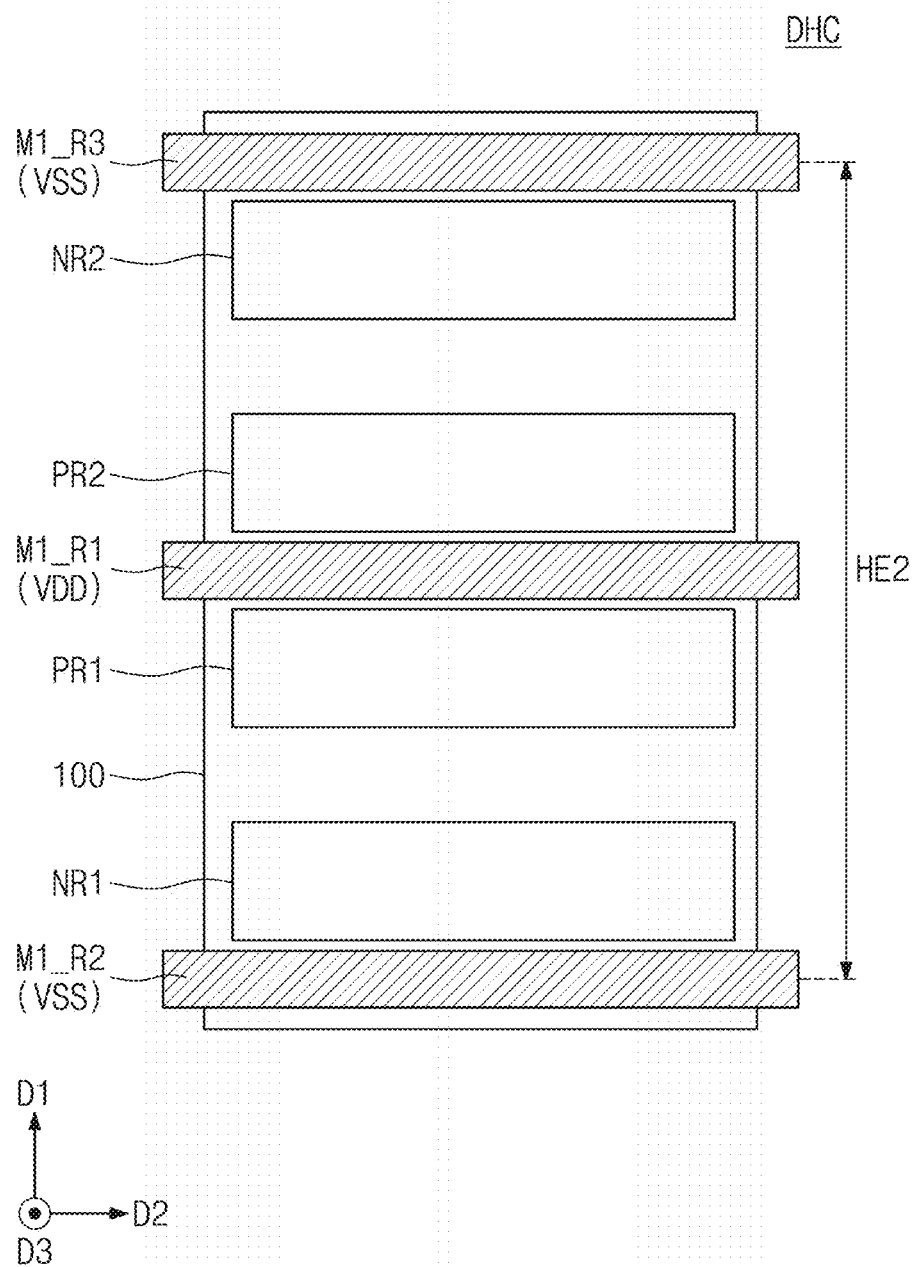
Figure 3:
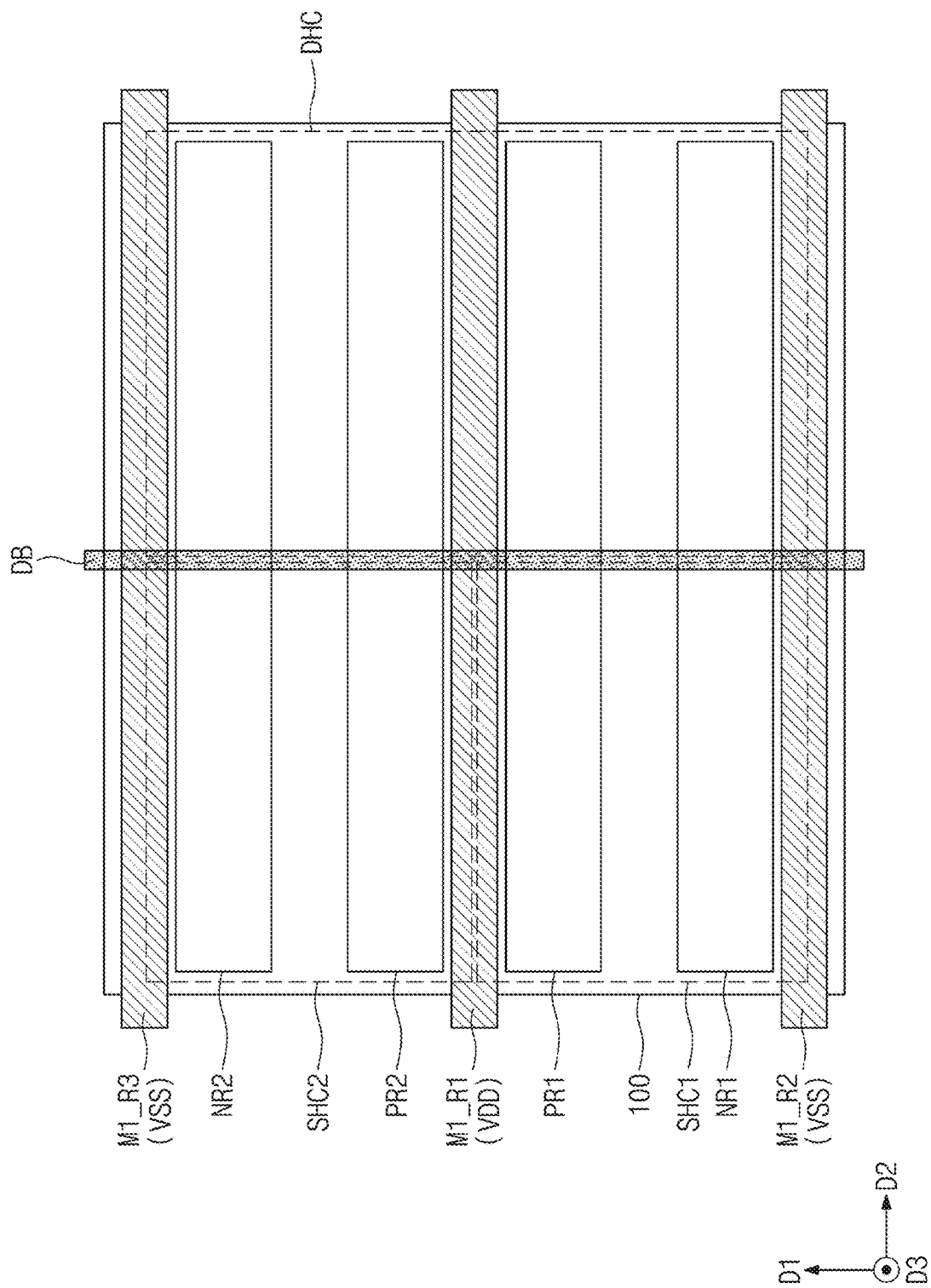

FIGS. 1 to 3 illustrate conceptual diagrams showing logic cells of a semiconductor device according to some example embodiments of inventive concepts.

Referring to FIG. 1, a single height cell SHC may be provided. For example, a substrate 100 may be provided thereon with a first power line M1_R1 and a second power line M1_R2. The first power line M1_R1 may be a path for providing a drain voltage VDD, for example, a power voltage. The second power line M1_R2 may be a path for providing a source voltage VSS, for example, a ground voltage.

The single height cell SHC may be defined between the first power line M1_R1 and the second power line M1_R2. The single height cell SHC may include one PMOSFET region PR and one NMOSFET region NR. For example, the single height cell SHC may have a CMOS structure provided between the first power line M1_R1 and the second power line M1_R2.

Each of the PMOSFET and NMOSFET regions PR and NR may have a first width W1 in a first direction D1. A first height HE1 may be defined as a length in the first direction D1 of the single height cell SHC. The first height HE1 may be substantially the same as a distance (e.g., a pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device and wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a drain voltage VDD.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R_1. When viewed in plan, the first power line M1_R1 may be disposed between the first and second PMOSFET regions PR1 and PR2.

A second height HE2 may be defined to refer to a length in the first direction D_1 of the double height cell DHC. The second height HE2 may be about twice the first height HE1 of FIG. 1. The first and second PMOSFET regions PR1 and PR2 of the double height cell DHC may collectively operate as a single PMOSFET region.

Therefore, the double height cell DHC may have a PMOS transistor whose size is greater than that of a PMOS transistor included in the single height cell SHC discussed above in FIG. 1. For example, the size of the PMOS transistor included in the double height cell DHC may be about twice that of the PMOS transistor included in the single height cell SHC. In conclusion, the double height cell DHC may operate at a higher speed than that of the single height cell SHC. In inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent to in the first direction D_1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
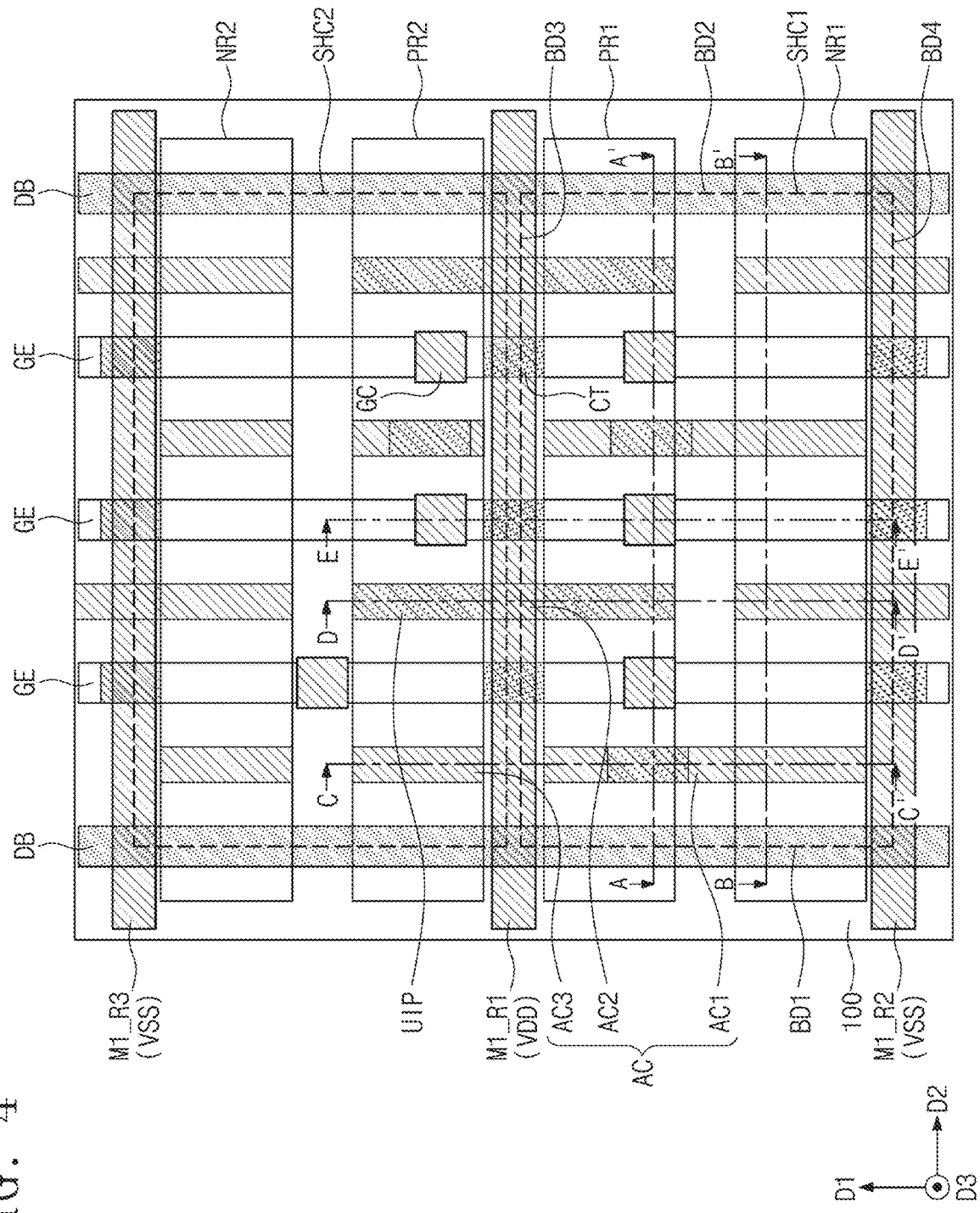
FIG. 4 illustrates a plan view showing a semiconductor device according to some example embodiments of inventive concepts.

FIG. 4 illustrates a plan view showing a semiconductor device according to some example embodiments of inventive concepts. FIGS. 5A, 5B, 5C, 5D, and 5E illustrate cross-sectional views respectively taken along lines A-A', B-B', C-C', D-D', and E-E' of FIG. 4. A semiconductor device shown in FIGS. 4 and 5A to 5E is a detailed example of the first and second single height cells SHC1 and SHC2 of FIG. 3.

Referring to FIGS. 4 and 5A to 5E, first and second single height cells SHC and SHC2 may be provided on a substrate 100. Each of the first and second single height cells SHC1 and SHC2 may include logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 in the second direction D2.

A second trench TR2 formed on an upper portion of the substrate 100 may define the first PMOSFET region PR1, the second PMOSFET region PR2, the first NMOSFET region NR1, and the second NMOSFET region NR2. For example, the second trench TR2 may be positioned between the first NMOSFET region NR1 and the first PMOSFET region PR1. The second trench TR2 may be positioned between the first PMOSFET region PR1 and the second PMOSFET region PR2. The second trench TR2 may be positioned between the second PMOSFET region PR2 and the second NMOSFET region NR2.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may extend parallel to each other in the second direction D2. The first and second active patterns AP1 and AP2 may be vertically protruding portions of the substrate 100. A first trench TR1 may be defined between neighboring first active patterns AP1 and between neighboring second active patterns AP2. The first trench TR1 may be shallower than the second trench TR2.

A device isolation layer ST may fill the first and second trenches TR1 and TR2. The device isolation layer ST may include a silicon oxide layer. The first and second active patterns AP1 and AP2 may have their upper portions that vertically protrude upwardly from the device isolation layer ST (see FIG. 5E). The first and second active patterns AP1 and AP2 may each have a fin shape at the upper portion thereof. The device isolation layer ST may cover neither the upper portion of the first active pattern AP1 nor the upper portion of the second active pattern AP2. The device isolation layers ST may cover a lower sidewall of the first and second active patterns AP1 and AP2.

First source/drain patterns SD1 may be provided on each of the first and second PMOSFET regions PR1 and PR2. The first source/drain patterns SD1 may be provided on the upper portion of each of the first active patterns AP1. The first source/drain patterns SD1 may be impurity regions having a first conductivity type (e.g., p-type). A first channel pattern CH1 may be interposed between a pair of first source/drain patterns SD1 that are adjacent to each other in the second direction D2.

Second source/drain patterns SD2 may be provided on each of the first and second NMOSFET regions NR1 and NR2. The second source/drain patterns SD2 may be provided on the upper portion of each of the second active patterns AP2. The second source/drain patterns SD2 may be impurity regions having a second conductivity type (e.g., n-type). A second channel pattern CH2 may be interposed between a pair of second source/drain patterns SD2 that are adjacent to each other in the second direction D2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. For another example, the first and second source/drain patterns SD1 and SD2 may have their top surfaces higher than those of the first and second channel patterns CH1 and CH2.

The first source/drain pattern SD1 may include a semiconductor element (e.g., SiGe) whose lattice constant is greater than that of a semiconductor element of the substrate 100. Therefore, a pair of first source/drain patterns SD1 may provide a compressive stress to the first channel pattern CH1 therebetween. For example, the second source/drain pattern SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged along the second direction D2 at a first pitch. The gate electrodes GE may vertically overlap the first and second channel patterns CH1 and CH2. The gate electrode GE may surround a top surface and opposite sidewalls of each of the first and second channel patterns CH1 and CH2.

Referring again to FIG. 5E, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor according to some example embodiments may be a three-dimensional field effect transistor (e.g., FinFET) in which the gate electrode GE three-dimensionally surrounds the first and second channel patterns CH1 and CH2.

For example, the first single height cell SHC1 may have a first boundary BD1 and a second boundary BD2 that are opposite to each other in the second direction D2. The first and second boundaries BD1 and BD2 may extend in the second direction D2. The first single height cell SHC1 may have a third boundary BD3 and a fourth boundary BD4 that are opposite to each other in the first direction D1. The third and fourth boundaries BD3 and BD4 may extend in the second direction D2.

Gate cutting patterns CT may be disposed on the third and fourth boundaries BD3 and BD4 of the first single height cell SHC1. The gate cutting patterns CT may be disposed on a boundary in the second direction D2 of each of the first and second single height cells SHC1 and SHC2. The gate cutting patterns CT may be arrange at the first pitch along the third boundary BD3. The gate cutting patterns CT may be arrange at the first pitch along the fourth boundary BD4. When viewed in plan, the gate cutting patterns CT on the third and fourth boundaries BD3 and BD4 may be disposed to overlap corresponding gate electrodes GE. The gate cutting patterns CT may include a dielectric material, such as a silicon oxide layer or a silicon nitride layer. Each of first, second, and third power lines M1_R1, M1_R2, and M1_R3 may vertically overlap the gate cutting pattern CT.

The gate cutting pattern CT may separate a gate electrode GE on the first single height cell SHC1 from a gate electrode GE on the second single height cell SHC2. The gate cutting pattern CT may be interposed between the gate electrode GE on the first single height cell SHC1 and the gate electrode GE on the second single height cell SHC2 For example, the gate cutting patterns CT may divide the gate electrode GE, which extends in the first direction D1, into a plurality of gate electrodes GE.

Referring back to FIGS. 4 and 5A to 5E, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include at least one selected from SiCN, SiCON, and SiN. For another example, the gate spacers GS may include a multi-layer formed of at least two selected from SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST below the gate electrode GE (see FIG. 5E).

In some example embodiments of inventive concepts, the gate dielectric pattern GI may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A semiconductor device according to some example embodiments of inventive concepts may include a negative capacitance field effect transistor that uses a negative capacitor. For example, the gate dielectric pattern GI may include a ferroelectric material layer that exhibits ferroelectric properties and a paraelectric material layer that exhibits paraelectric properties.

The ferroelectric material layer may have a negative capacitance. The paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value and may be increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a subthreshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxide (O).

The ferroelectric material layer may further include impurities doped thereinto. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to 10 atomic percent silicon. When the impurities are yttrium (Y), the ferroelectric material layer may include about 2 to 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm. Because ferroelectric materials have their own critical thicknesses exhibiting ferroelectric properties, the thickness of the ferroelectric material layer may depend on ferroelectric material.

For example, the gate dielectric pattern GI may include a high-k dielectric material. For another example, the gate dielectric pattern GI may include a plurality of ferroelectric material layers that are spaced apart from each other. The gate dielectric pattern GI may have a stacked layered structure in which a plurality of ferroelectric material layers are stacked alternately with a plurality of paraelectric material layers.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). The first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second single height cells SHC1 and SHC2 may be provided on its sides with a pair of separation structures DB that are opposite to each other in the second direction D2. For example, the pair of separation structures DB may be correspondingly provided on the first and second boundaries BD1 and BD2 of the first single height cell SHC1. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120, and may extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 and to correspondingly have electrical connections with the first and second source/drain patterns SD1 and SD2. Each of the active contacts AC may be provided between a pair of gate electrodes GE. When viewed in plan, each of the active contacts AC may have a linear or bar shape that extends in the first direction D1.

The active contact AC may be a self-aligned contact. For example, the gate capping pattern GP and the gate spacer GS may be used to form the active contact AC in a self-aligned manner. For example, the active contact AC may cover at least a portion of a sidewall of the gate spacer GS. Although not shown, the active contact AC may cover a portion of the top surface of the gate capping pattern GP.

Silicide patterns SC may be correspondingly interposed between the active contacts AC and the first source/drain patterns SD1 and between the active contacts AC and the second source/drain patterns SD2. The active contacts AC may be electrically connected through the active contacts AC to the first and second source/drain patterns SD1 and SD2. The silicide pattern SC may include metal silicide, for example, at least one selected from titanium silicide, tantalum silicide, tungsten silicide, nickel silicide, and cobalt silicide.

The active contacts AC may include a first active contact AC1, a second active contact AC2, and a third active contact AC3. The first active contact AC1 on the first single height cell SHC1 may electrically connect the first source/drain pattern SD1 of the first PMOSFET region PR1 to the second source/drain pattern SD2 of the first NMOSFET region NR1. The first active contact AC1 may extend in the first direction D1 from the second source/drain pattern SD2 on the first NMOSFET region NR1 to the first source/drain pattern SD1 on the first PMOSFET region PR1.

The second active contact AC2 may electrically connect the first source/drain pattern SD1 of the first PMOSFET region PR1 to the first source/drain pattern SD1 of the second PMOSFET region PR2. The second active contact AC2 may extend in the second direction D2 from the first source/drain pattern SD1 of the first PMOSFET region PR1 to the first source/drain pattern SD1 of the second PMOSFET region PR2. The second active contact AC2 may run across a boundary (e.g., the third boundary BD3) between the first and second single height cells SHC1 and SHC2, and may be coupled in common to the first PMOSFET region PR1 of the first single height cell SHC1 and the second PMOSFET region PR2 of the second single height cell SHC2. The second active contact AC2 may be electrically connected through a first via VI1 to the first power line M1_R1 of a first metal layer M1 which will be discussed below.

The third active contact AC3 on the second single height cell SHC2 may be provided on only the first source/drain pattern SD1 of the second PMOSFET region PR2 or the second source/drain pattern SD1 of the second NMOSFET region NR2. Unlike the first active contact AC1 or the second active contact AC2, the third active contact AC3 may be provided locally on one active region and may not connect neighboring active regions to each other.

When viewed in plan, a length in the first direction D1 of the third active contact AC3 may be less than a length in the first direction D1 of each of the first and second active contacts AC1 and AC2. For example, the length of the third active contact AC3 may be less than half the length of each of the first and second active contacts AC1 and AC2.

Gate contacts GC may be provided to penetrate the second interlayer dielectric layer 120 and the gate capping pattern GP and to correspondingly have electrical connections with the gate electrodes GE. When viewed in plan, the gate contacts GC on the first single height cell SHC1 may be disposed to overlap the first PMOSET region PR1. For example, the gate contacts GC on the first single height cell SHC1 may be provided on the first active pattern AP1 (see FIG. 5A).

The gate contact GC may be freely disposed without being limited to its position on the gate electrode GE. For example, the gate contacts GC on the second single height cell SHC2 may be disposed on the second PMOSFET region PR2 and the device isolation layer ST that fills the second trench TR2. Although not shown, the gate contacts GC on the second single height cell SHC2 may be disposed on the second NMOSFET region NR2.

Referring back to FIGS. 5A, 5C, and 5D, an upper dielectric pattern UIP may fill an upper portion of each active contact AC adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC (see FIG. 5A). Therefore, it may be possible to limit and/or prevent a short circuit resulting from contact between the gate contact GC and its adjacent active contact AC.

Figure 5A:
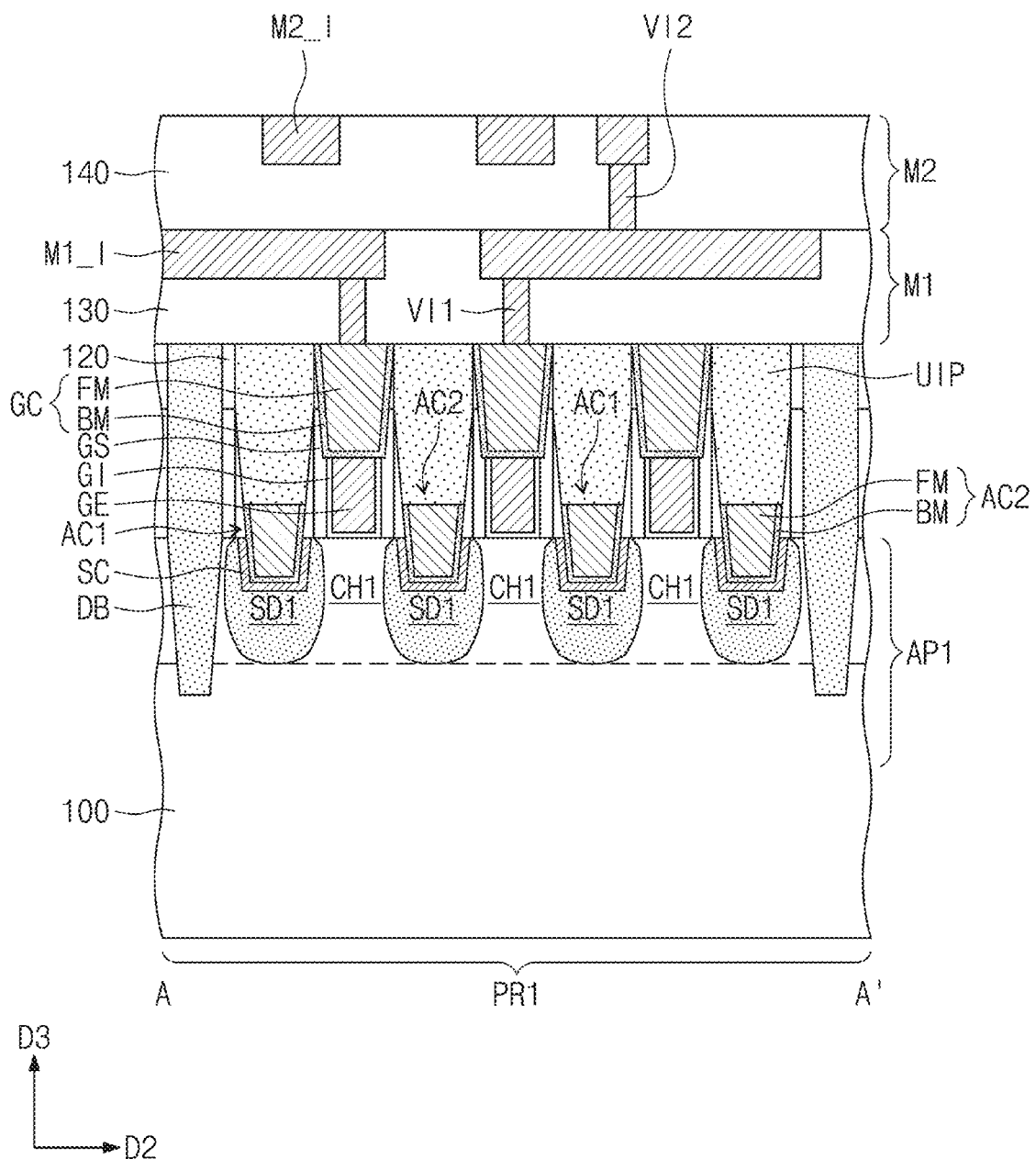
Figure 5B:
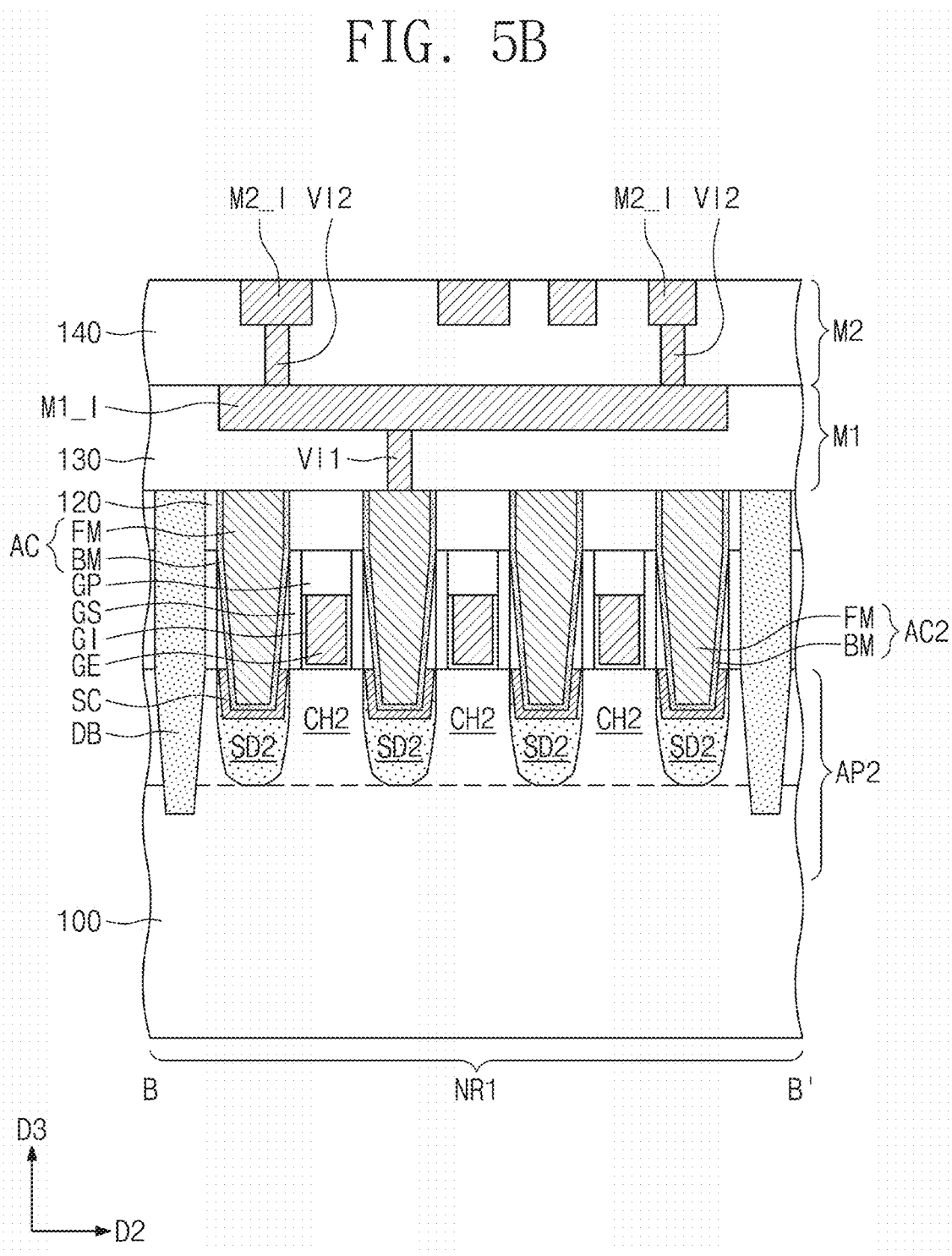
Figure 5D:
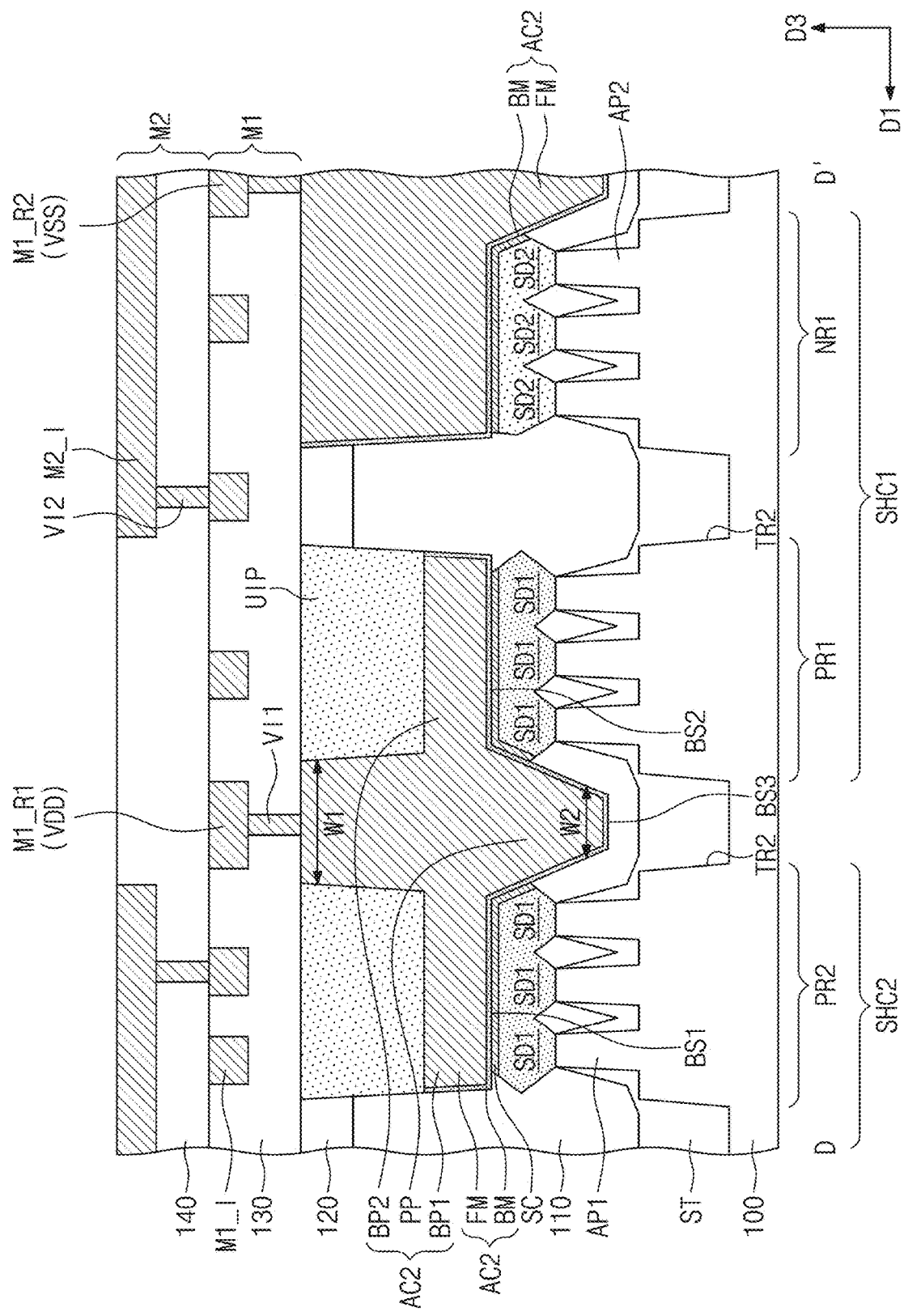
Figure 5E:
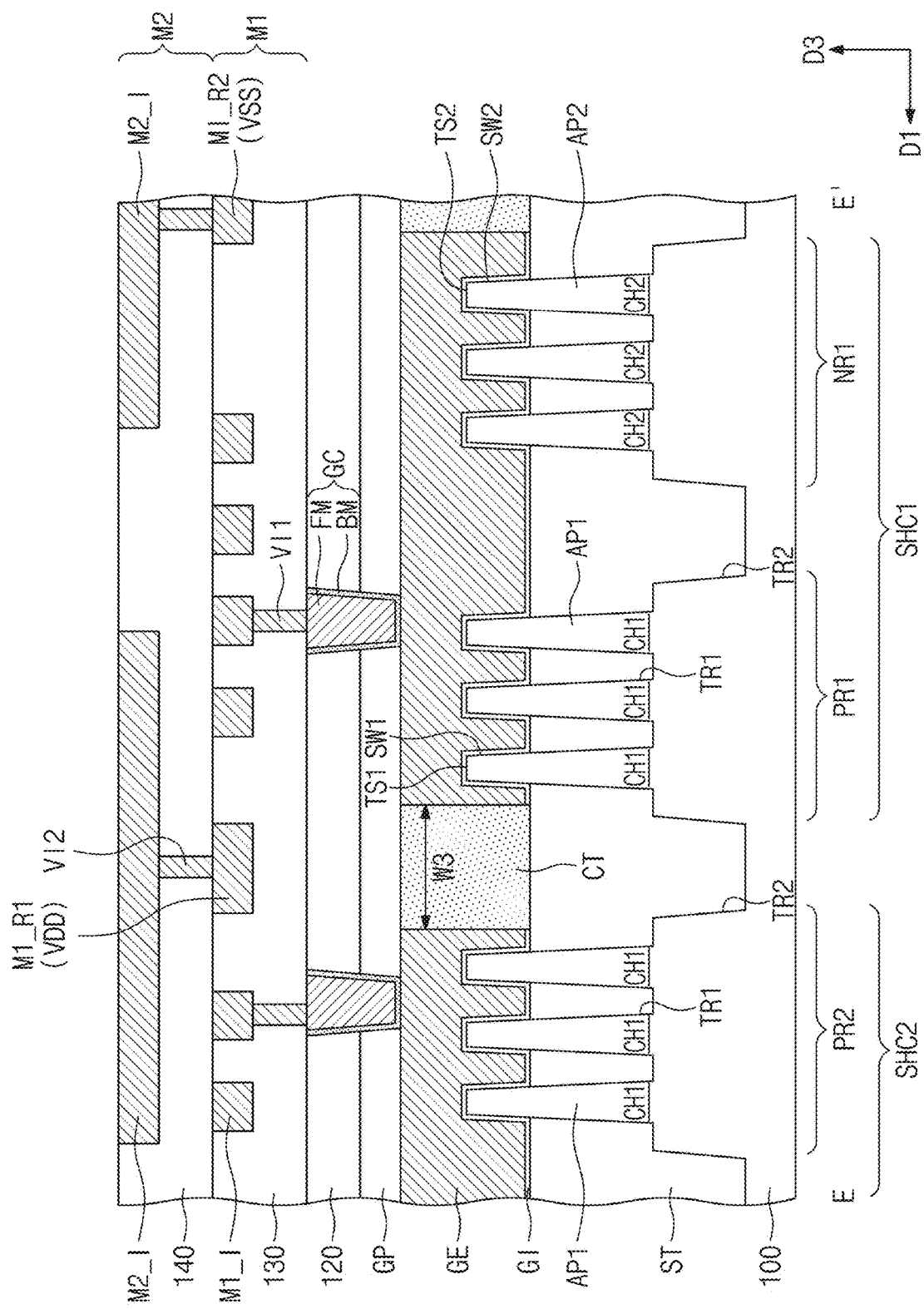

Two upper dielectric patterns UIP may be disposed in the active contact AC that longitudinally extends in the first direction D1 like the second active contact AC2 shown in FIG. 5D. The upper dielectric patterns UIP on the second active contact AC2 may be spaced apart from each other in the first direction D1. For example, the upper dielectric patterns UIP on the second active contact AC2 may be disposed on the first PMOSFET region PR1 of the first single height cell SHC1 and the second PMOSFET region PR2 of the second single height cell SHC2.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend parallel to each other in the second direction D2.

For example, the first and second power lines M1_R1 and M1_R2 may be correspondingly provided on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged at a second pitch along the first direction D1. The second pitch may be less than the first pitch. Each of the first wiring lines M1_I may have a line-width less than that of each of the first, second, and third power lines M1_R1, M1_R2, and M1_R3.

The first metal layer M1 may further include first vias VI_1. The first vias VI1 may be correspondingly provided below the lines M1_R1, M1_R2, M1_R3, and M1_I of the first metal layer M_1. The first via VI1 may electrically connect the active contact AC to a corresponding one of the lines M1_R1, M1_R2, M1_R3, and M1_I of the first metal layer M1. The first via VI1 may electrically connect the gate contact GC to a corresponding one of the lines M1_R1, M1_R2, M1_R3, and M1_I of the first metal layer M1.

For example, a certain line and its underlying first via VI1 of the first metal layer M1 may be formed by individual processes. In more detail, the certain line and its underlying first via VI1 of the first metal layer M1 may each be formed by a single damascene process. A sub-20 nm process may be employed to fabricate a semiconductor device according to some example embodiments.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend parallel to each other in the first direction D1.

The second metal layer M2 may further include second vias VI2 below the second wiring lines M2_I. A certain line of the first metal layer M1 may be electrically through the second via VI2 to a corresponding line of the second metal layer M2. A certain line and its underlying second via VI2 of the second metal layer M2 may be simultaneously formed by a dual damascene process.

The first and second metal layers M1 and M2 may have their lines that include the same or different conductive materials. For example, the first and second metal layers M1 and M2 may have their lines that include at least one metallic material selected from aluminum, copper, tungsten, molybdenum, and cobalt. Although not shown, other metal layers (e.g., M3, M4, M5, etc.) may be additionally stacked on the fourth interlayer dielectric layer 140. Each of the stacked metal layers may include lines for routing between cells.

The active contact AC of inventive concepts will be further discussed in detail with reference back to FIGS. 5C and 5D. The first active contact AC1 may include a first body BP1 on the first source/drain pattern SD1 and a second body BP2 on the second source/drain pattern SD2. The first body BP1 of the first active contact AC1 may be connected through the silicide pattern SC to a top surface of the first source/drain pattern SD1, and the second body BP2 of the first active contact AC1 may be connected through the silicide pattern SC to a top surface of the second source/drain pattern SD2. The second active contact AC2 may include a first body BP1 on the first source/drain pattern SD1 of the second single height cell SHC2 and a second body BP2 on the first source/drain pattern SD1 of the first single height cell SHC1. Each of the first and second bodies BP1 and BP2 of the second active contact AC2 may be connected through the silicide pattern SC to a top surface of the first source/drain pattern SD1.

Each of the first and second active contacts AC1 and AC2 may include a protrusion PP between the first body BP1 and the second body BP2. The protrusion PP of the first active contact AC1 may be provided on the device isolation layer ST between the first PMOSFET region PR1 and the first NMOSFET region NR1. The protrusion PP of the second active contact AC2 may be provided on the device isolation layer ST between the first PMOSFET region PR1 and the second PMOSFET region PR2. The protrusion PP may be a portion that protrudes toward the device isolation layer ST.

The protrusion PP may extend toward the device isolation layer ST, while running along an inclined sidewall of either the first source/drain pattern SD1 or the second source/drain pattern SD2. The protrusion PP may have a bottom surface BS3 lower than a bottom surface BS1 of the first body BP1 and a bottom surface BS2 of the second body BP2. The bottom surface BS3 of the protrusion PP may be located higher than the device isolation layer ST. For example, the protrusion PP may be spaced apart from the device isolation layer ST across the first interlayer dielectric layer 110. The protrusion PP of the second active contact AC2 may not vertically overlap, but may be horizontally offset from the upper dielectric patterns UIP.

Each of the first and second active contacts AC1 and AC2 may be connected through the protrusion PP to the inclined sidewall of either the first source/drain pattern SD1 or the second source/drain pattern SD2. For example, the protrusion PP may increase a contact area between the active contact AC and each of the first and second source/drain patterns SD1 and SD2. Therefore, a reduced resistance may be provided between the active contact AC and each of the first and second source/drain patterns SD1 and SD2.

Referring back to FIG. 5D, the second active contact AC2 may have a first width W1 or a minimum width in the first direction D1 at its portion interposed between neighboring upper dielectric patterns UIP. The protrusion PP may have a second width W2 or a minimum width in the first direction D1. Referring back to FIG. 5E, the gate cutting pattern CT may have a third width W3 or a width in the first direction D1. The first width W1 may be substantially the same as the third width W3. For example, a ratio of the first width W1 to the third width W3 may range from about 0.8 to about 1.2. The second width W2 may be less than the third width W3.

The second active contact AC2 may have a minimum width at its portion interposed between neighboring upper dielectric patterns UIP, and the gate cutting pattern CT may have a width that substantially corresponds to the minimum width at the portion of the second active contact AC2. The second active contact AC2 may thus be limited and/or prevented from being cut-off due to the upper dielectric patterns UIP. As a result, a semiconductor device may increase in electrical characteristics. This will be discussed in detail below.

Figure 6A:
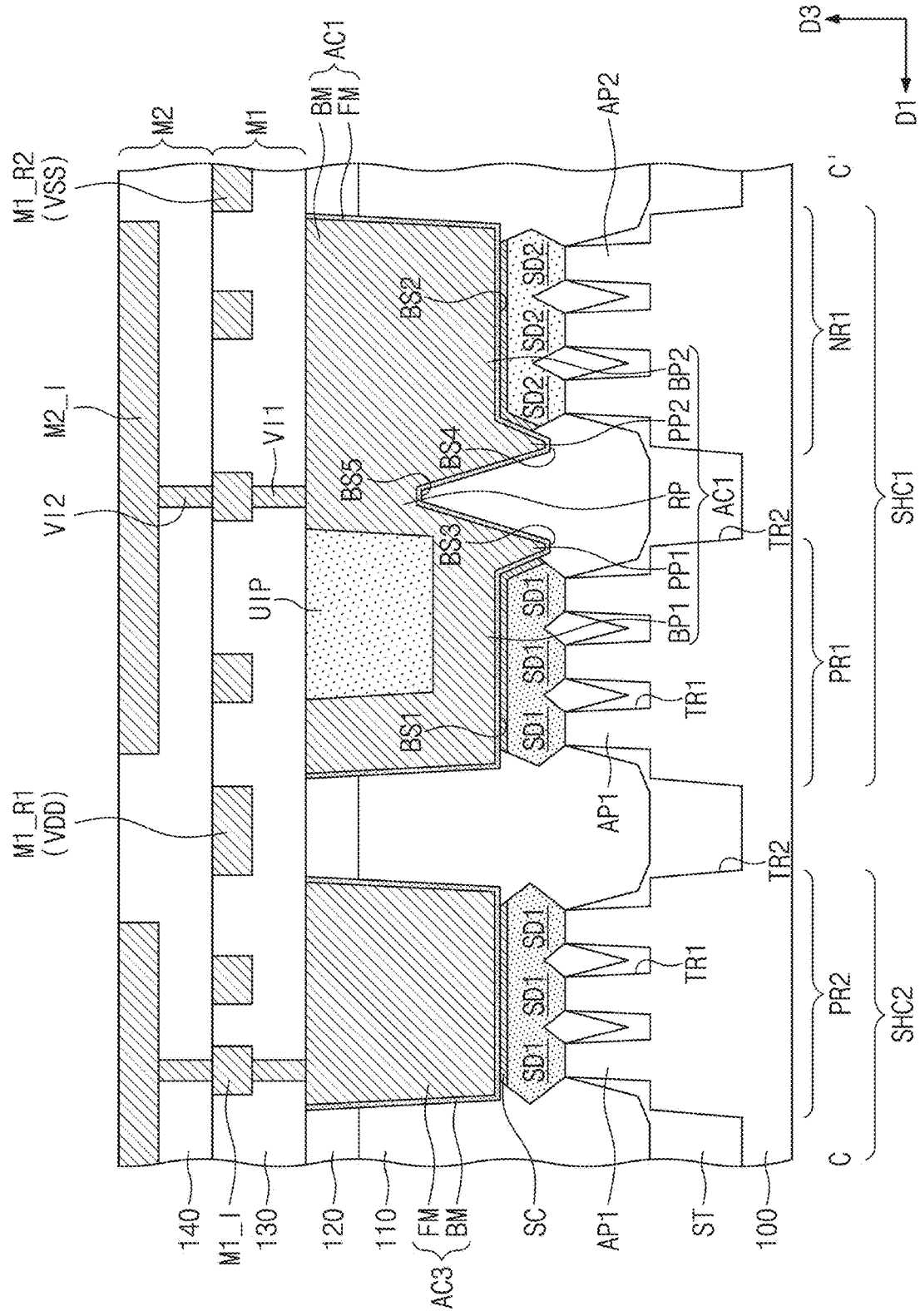
FIGS. 6A and 6B illustrate cross-sectional views respectively taken along lines C-C' and D-D' of FIG. 4, showing a semiconductor device according to some example embodiments of inventive concepts.
Figure 6B:
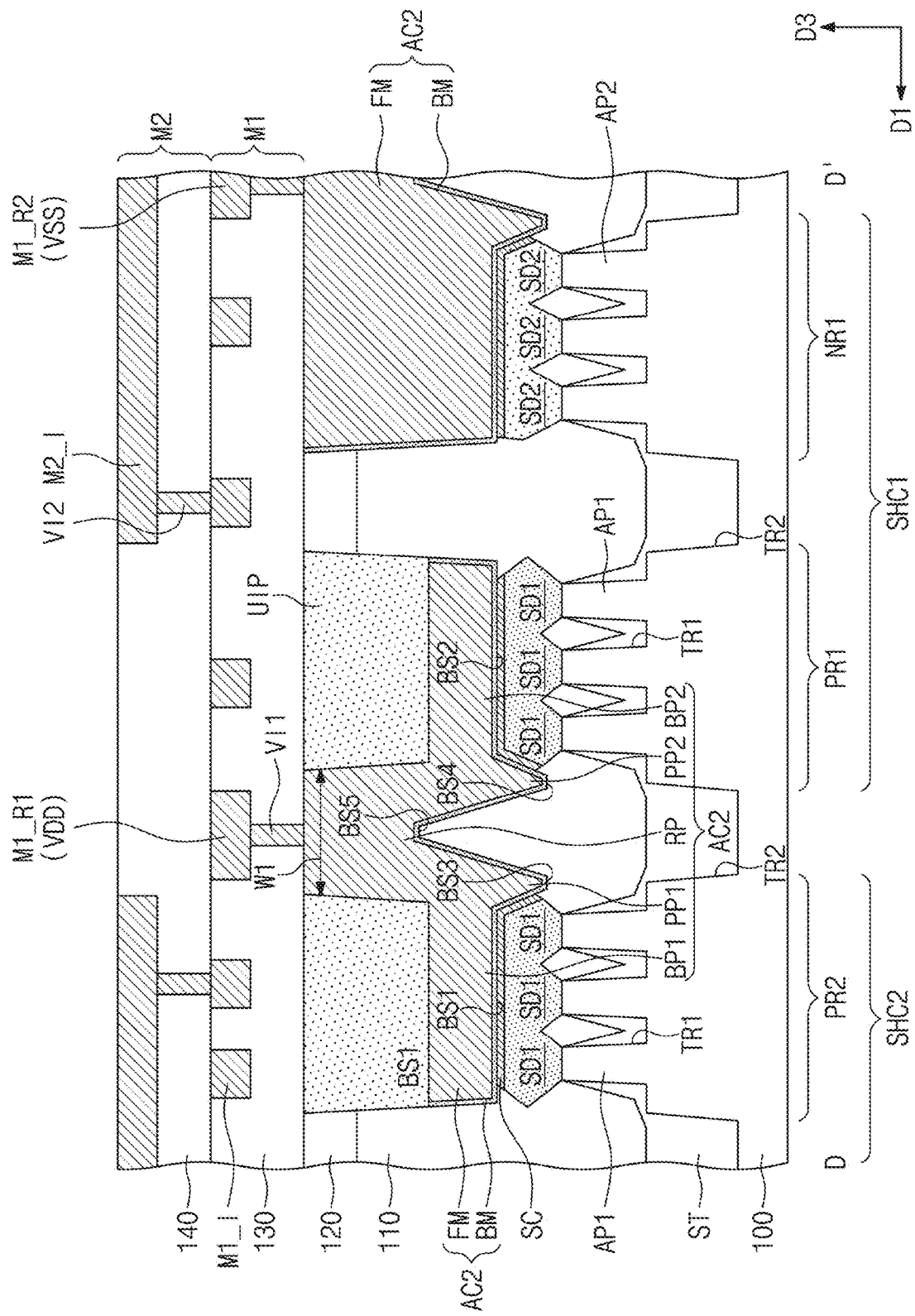

FIGS. 6A and 6B illustrate cross-sectional views respectively taken along lines C-C' and D-D' of FIG. 4, showing a semiconductor device according to some example embodiments of inventive concepts. In the embodiment that follows, a detailed description of technical features repetitive to those discussed above with reference to FIGS. 4 and 5A to 5D will be omitted, and a difference thereof will be discussed in detail.

Referring to FIGS. 6A and 6B, the protrusion of each of the first and second active contacts AC1 and AC2 may include a first protrusion PP1 and a second protrusion PP2. The first protrusion PP1 of the first active contact AC1 may extend from the first body BP1 toward the device isolation layer ST, while running along the inclined sidewall of the first source/drain pattern SD1. The second protrusion PP2 of the first active contact AC1 may extend from the second body BP2 toward the device isolation layer ST, while running along the inclined sidewall of the second source/drain pattern SD2. The first protrusion PP1 of the second active contact AC2 may extend from the first body BP1 toward the device isolation layer ST, while running along the inclined sidewall of the first source/drain pattern SD1. The second protrusion PP2 of the second active contact AC2 may extend from the second body BP2 toward the device isolation layer ST, while running along the inclined sidewall of the first source/drain pattern SD1.

The bottom surface BS3 of the first protrusion PP1 may be lower than the bottom surface BS1 of the first body BP1. The bottom surface BS3 of the first protrusion PP1 may be located higher than the device isolation layer ST. For example, the first protrusion PP1 may be spaced apart from the device isolation layer ST across the first interlayer dielectric layer 110.

The second protrusion PP2 may have a bottom surface BS4 lower than the bottom surface BS2 of the second body BP2. The bottom surface BS4 of the second protrusion PP2 may be located higher than the device isolation layer ST. For example, the second protrusion PP2 may be spaced apart from the device isolation layer ST across the first interlayer dielectric layer 110.

Each of the first and second active contacts AC1 and AC2 may include a recession RP between the first and second protrusions PP1 and PP2. The first protrusion PP1, the second protrusion PP2, and the recession RP of the first active contact AC1 may be provided on the device isolation layer ST between the first PMOSFET region PR1 and the first NMOSFET region NR1. The first protrusion PP1, the second protrusion PP2, and the recession RP of the second active contact AC2 may be provided on the device isolation layer ST between the first PMOSFET region PR1 and the second PMOSFET region PR2.

The recession RP may have a bottom surface BS5 higher than the bottom surface BS3 of the first protrusion PP1 and the bottom surface BS4 of the second protrusion PP2. The bottom surface BS5 of the recession RP may be located at a level different from that of the bottom surface BS1 of the first body BP1 and that of the bottom surface BS2 of the second body BP2. For example, the bottom surface BS5 of the recession RP may be located at a level higher than that of the bottom surface BS1 of the first body BP1 and that of the bottom surface BS2 of the second body BP2. For another example, although not shown, the bottom surface BS5 of the recession RP may be located at a level lower than that of the bottom surface BS1 of the first body BP1 and that of the bottom surface BS2 of the second body BP2.

The second contact AC2 may have a first width W1 or a minimum width in the first direction D1 at its portion interposed between neighboring upper dielectric patterns UIP. A second width W2 may be given as a minimum width in the first direction D1 of either the first protrusion PP1 or the second protrusion PP2. Referring again to FIG. 5E, the gate cutting pattern CT may have a third width W3 or a width in the first direction D1. The first width W1 may be substantially the same as the third width W3. For example, a ratio of the first width W1 to the third width W3 may range from about 0.8 to about 1.2. The second width W2 may be less than the third width W3.

Figure 7:
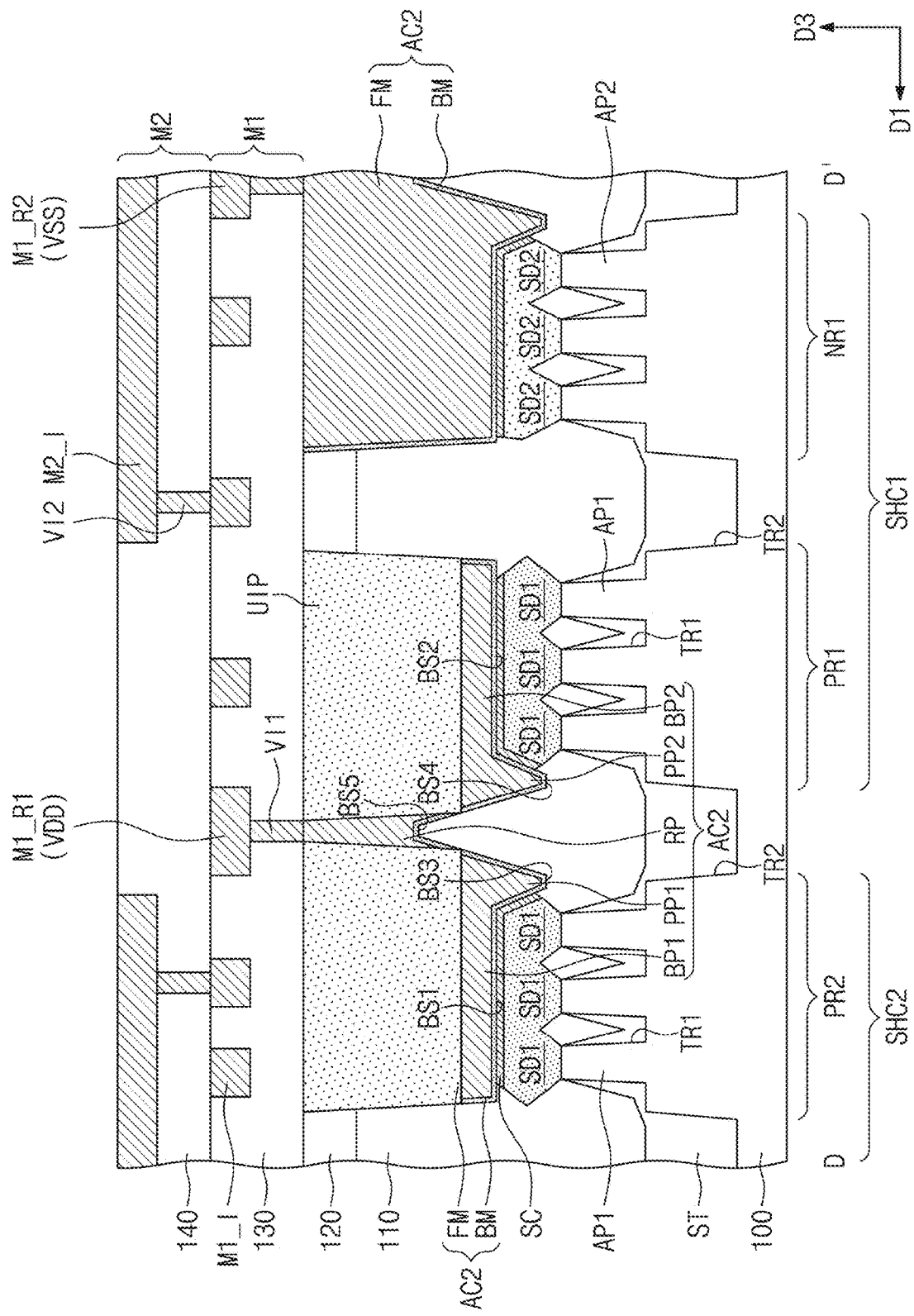
FIG. 7 illustrates a cross-sectional view taken along line D-D' of FIG. 4, showing a semiconductor device according to some example embodiments of inventive concepts.
Figure 8:
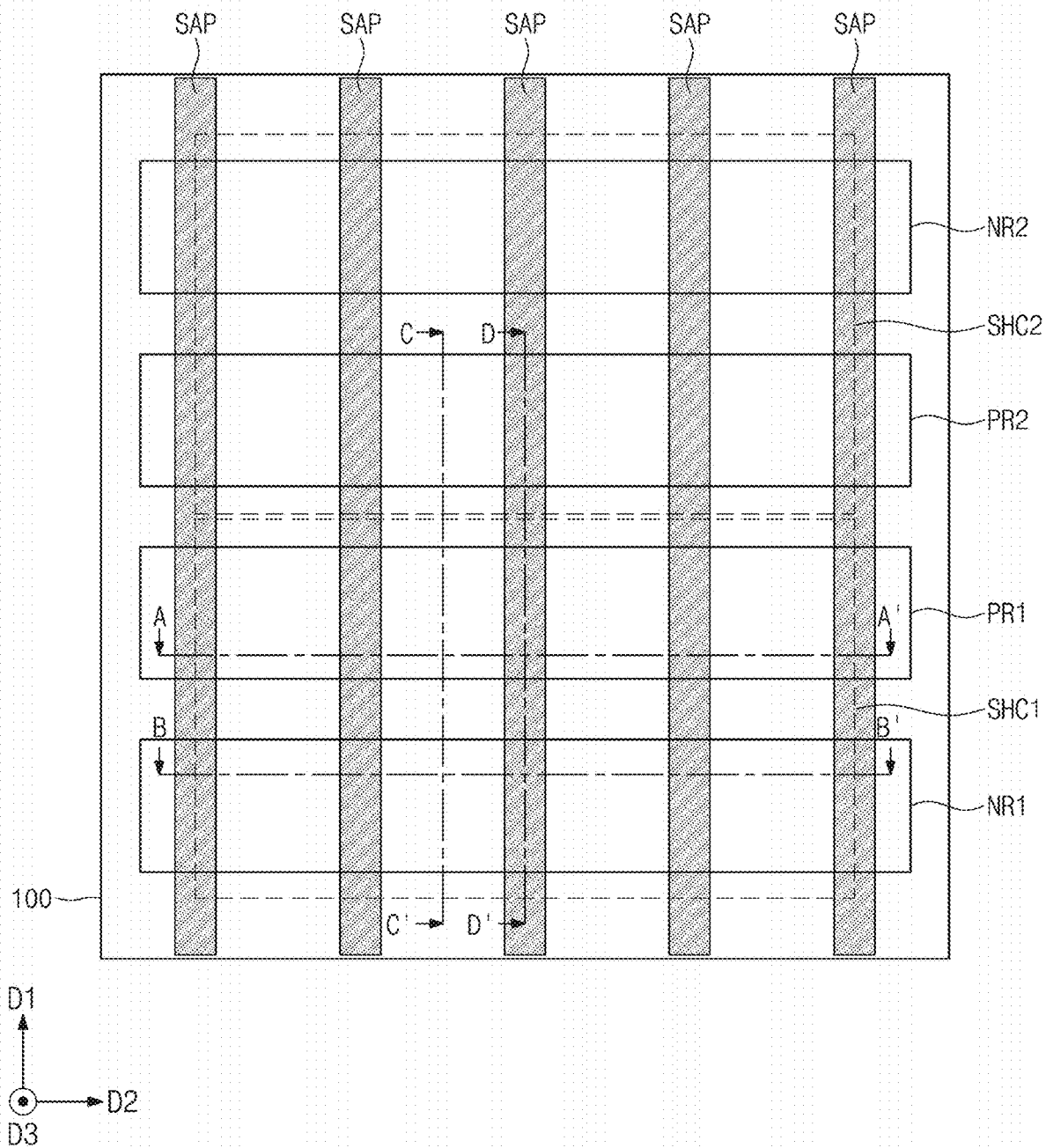
FIGS. 8, 10, 12, and 14 illustrate plan views showing a method of fabricating a semiconductor device according to some example embodiments of inventive concepts.

FIG. 7 illustrates a cross-sectional view taken along line D-D' of FIG. 4, showing a semiconductor device according to some example embodiments of inventive concepts. In the embodiment that follows, a detailed description of technical features repetitive to those discussed above with reference to FIGS. 4, 5A to 5D, 6A, and 6B will be omitted and a difference will be discussed in detail.

Referring to FIG. 7, as discussed with reference to FIG. 6B, the second active contact AC2 may include the first protrusion PP1, the second protrusion PP2, and the recession RP. The second active contact AC2 may be provided on its upper portion with the upper dielectric patterns UIP that are spaced apart from each other in the first direction D1. The second active contact AC2 may have a minimum width at its portion interposed between neighboring upper dielectric patterns UIP, and the minimum width may not correspond to a width of the gate cutting pattern CT. For example, the minimum width at the portion of the second active contact AC2 between neighboring upper dielectric patterns UIP may be less than the width of the gate cutting pattern CT. The second active contact AC2 may thus be cut-off due to the upper dielectric patterns UIP.

According to some example embodiments of inventive concepts, the width of the gate cutting pattern CT may substantially correspond to the minimum width at the portion of the second active contact AC2 between neighboring upper dielectric patterns UIP. The second active contact AC2 may thus be limited and/or prevented from being cut-off due to the upper dielectric patterns UIP. As a result, a semiconductor device may increase in electrical characteristics.

Figure 9A:
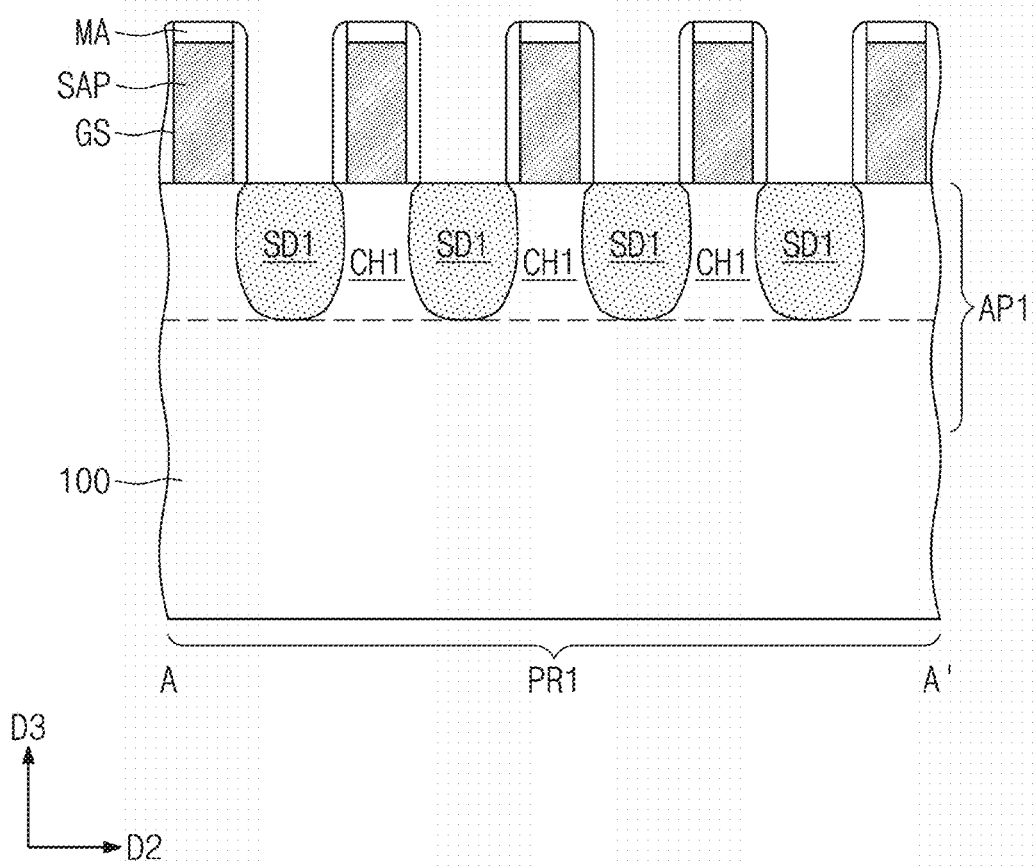
FIGS. 9A, 11A, 13A, and 15A illustrate cross-sectional views taken along line A-A' of FIGS. 8, 10, 12, and 14, respectively.
Figure 9B:
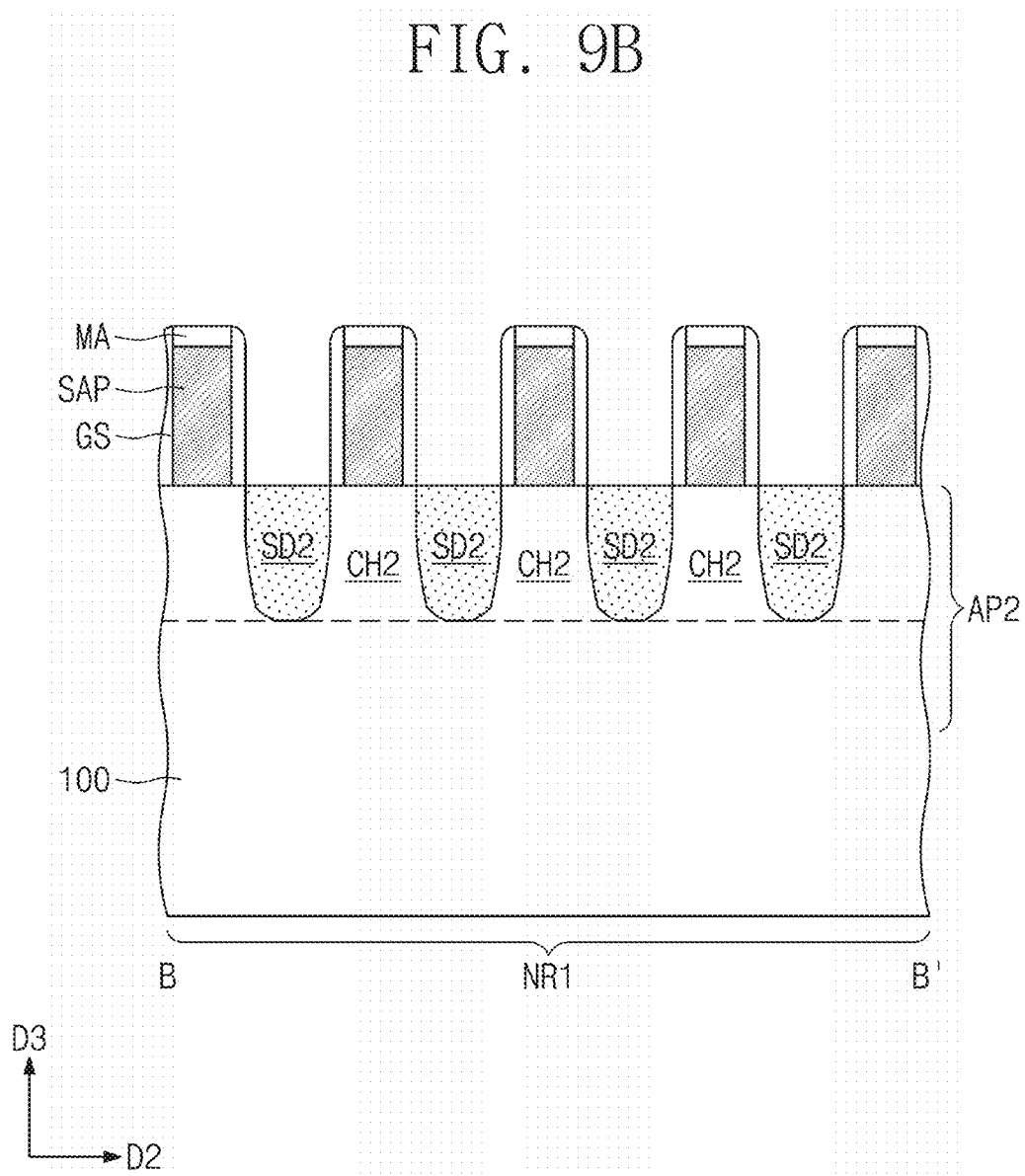
FIGS. 9B, 11B, 13B, and 15B illustrate cross-sectional views taken along line B-B' of FIGS. 8, 10, 12, and 14, respectively.
Figure 9C:
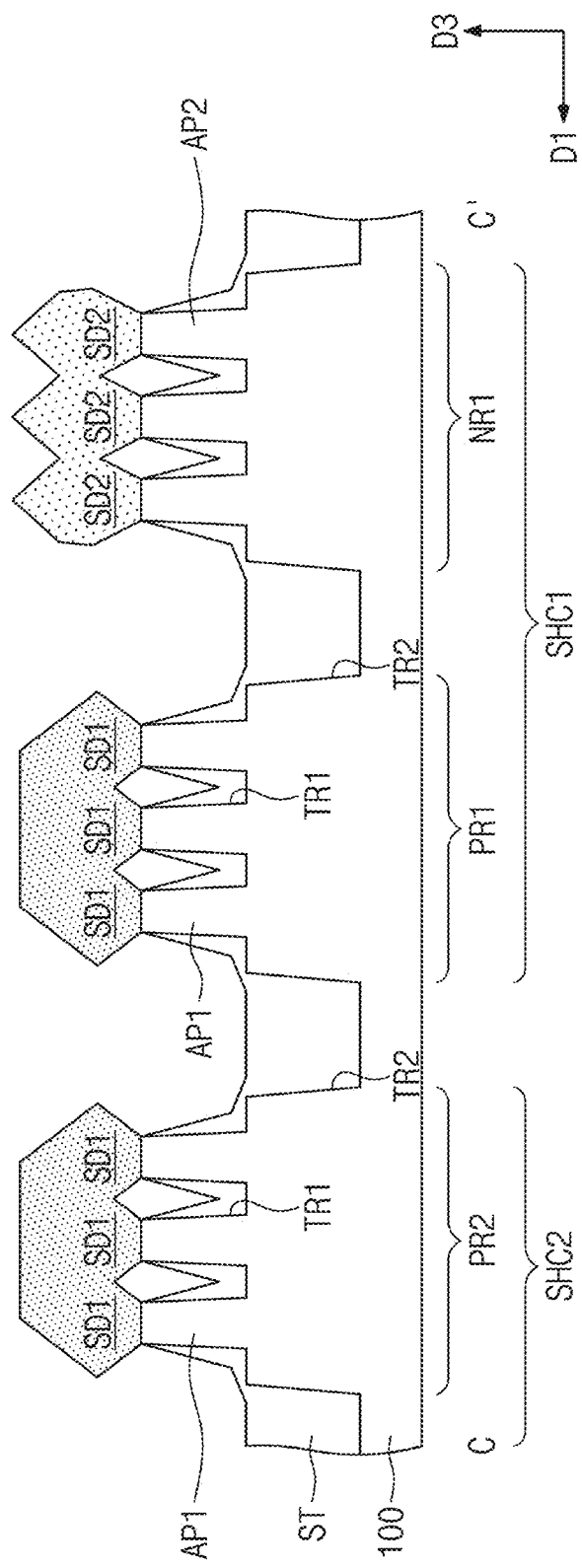
FIGS. 9C, 11C, 13C, and 15C illustrate cross-sectional views taken along line C-C' of FIGS. 8, 10, 12, and 14, respectively.
Figure 9D:
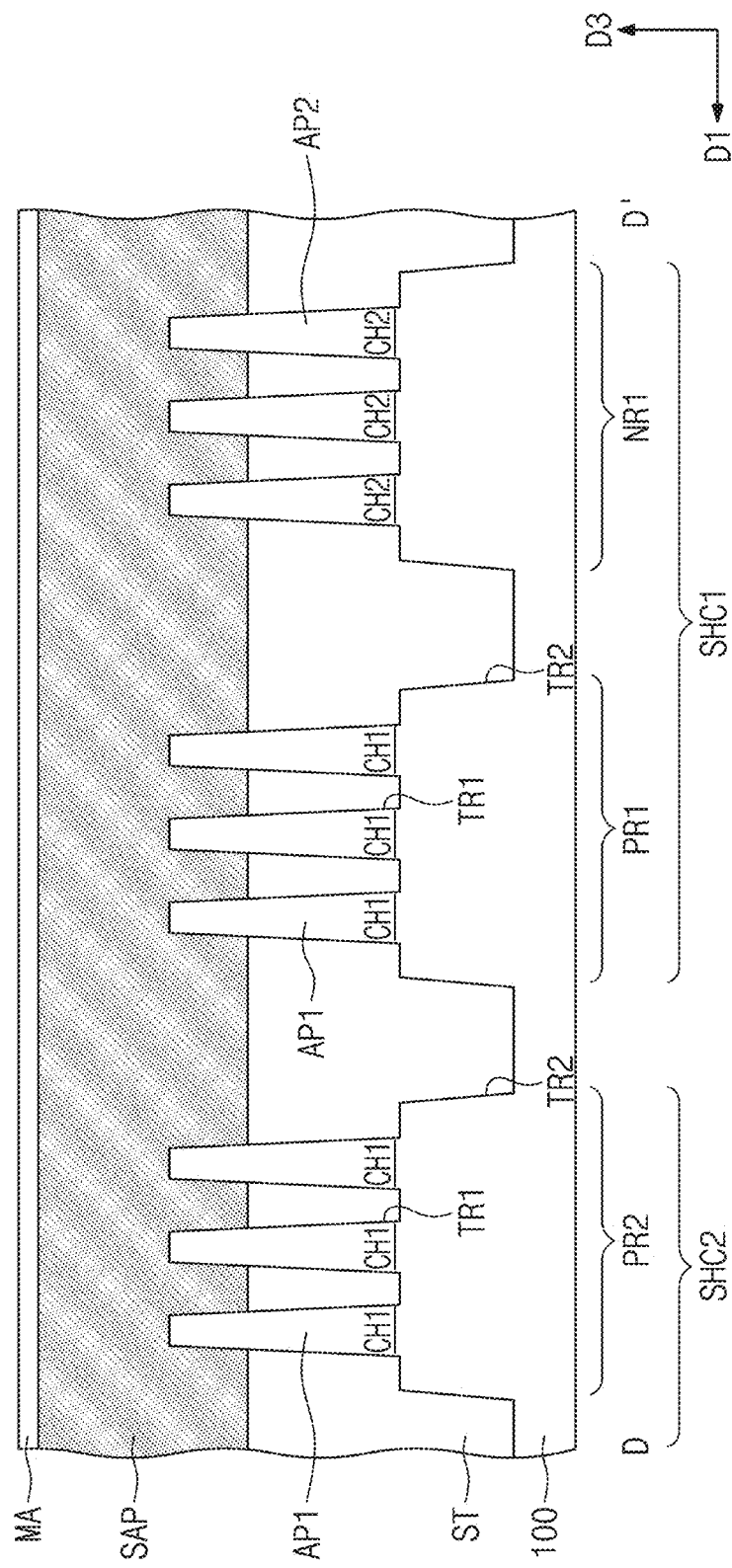
FIGS. 9D and 11D illustrate cross-sectional views taken along line D-D' of FIGS. 8 and 10, respectively.
Figure 10:
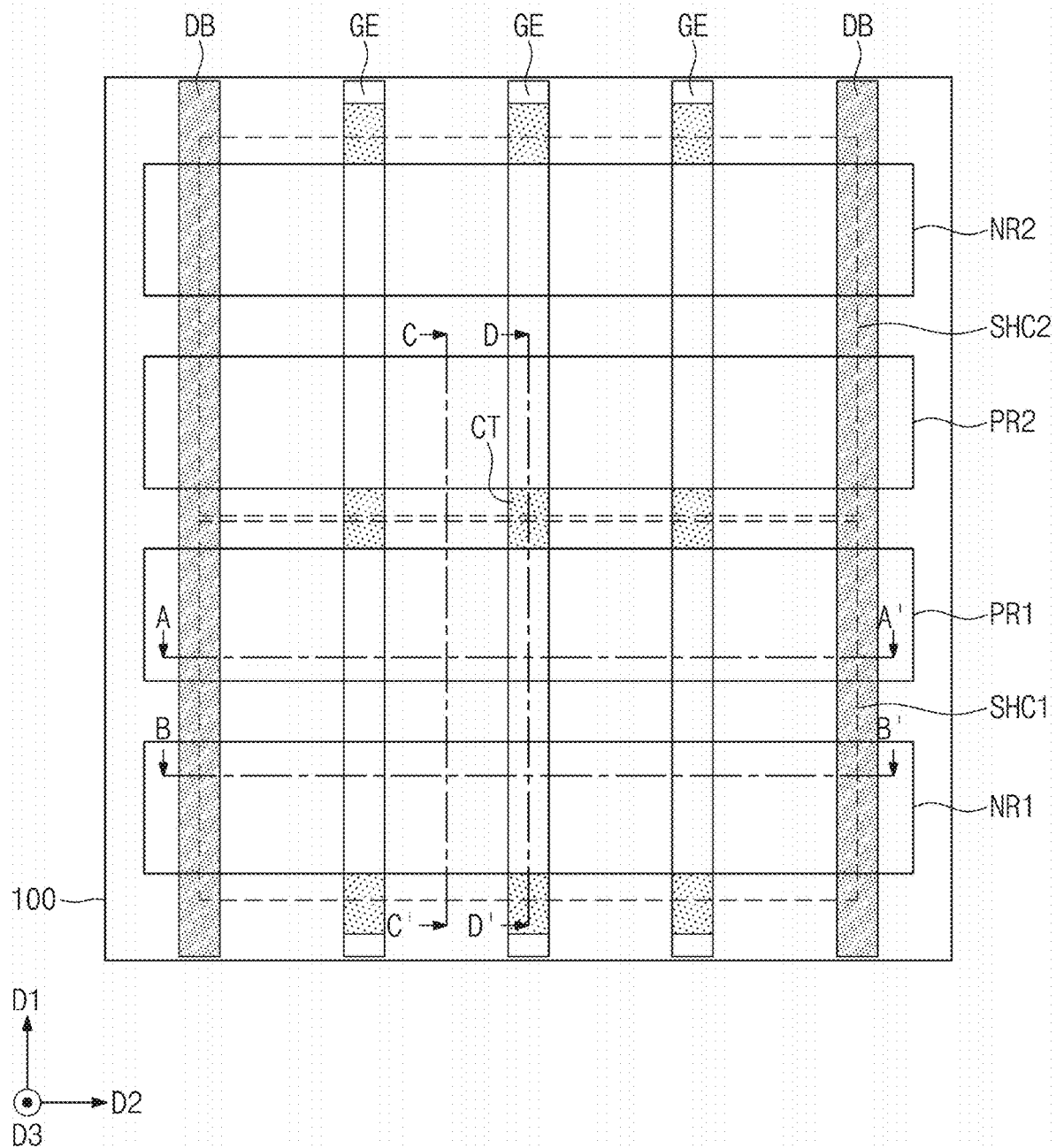
Figure 11A:
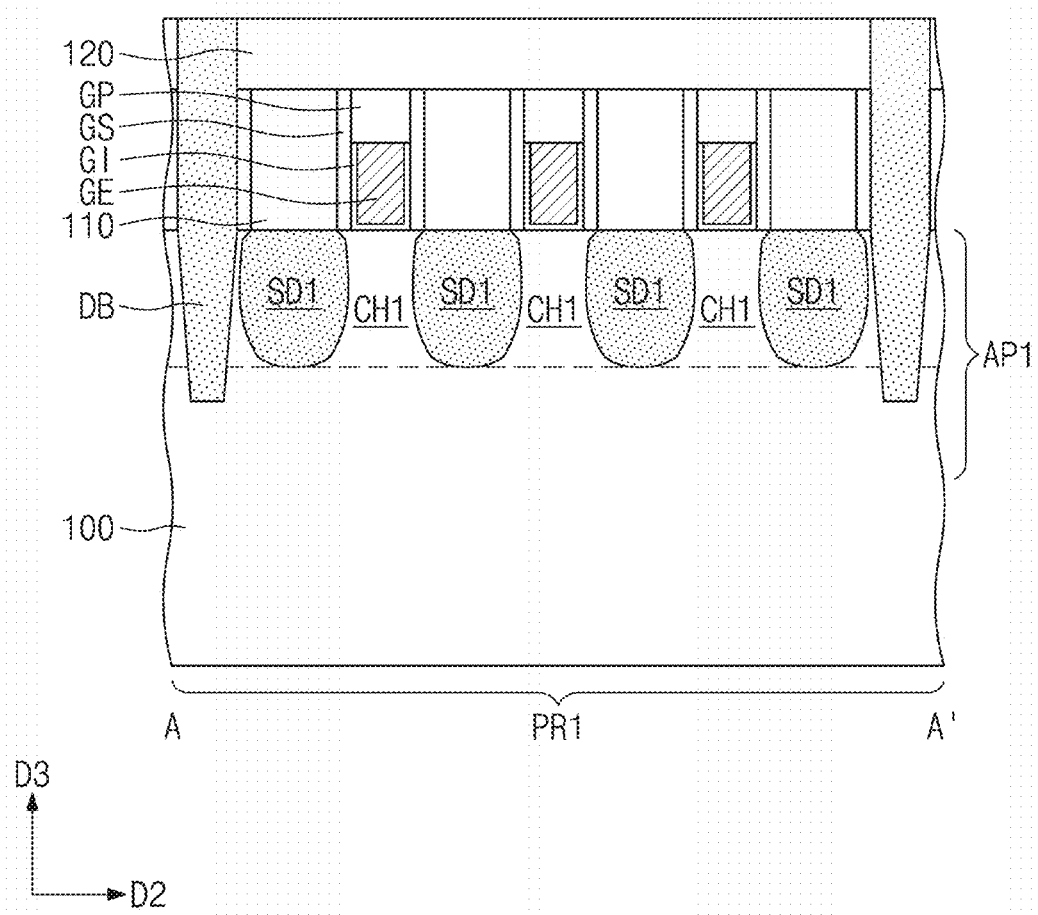
Figure 11B:
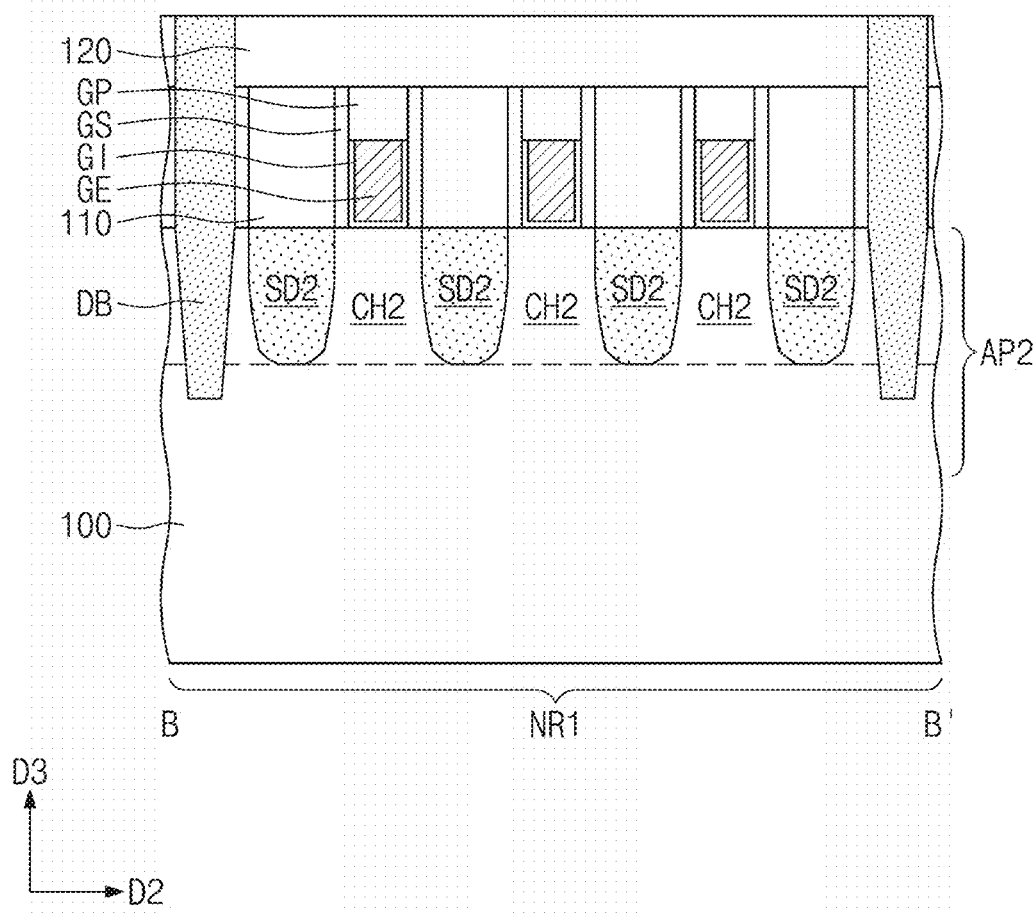
Figure 11C:
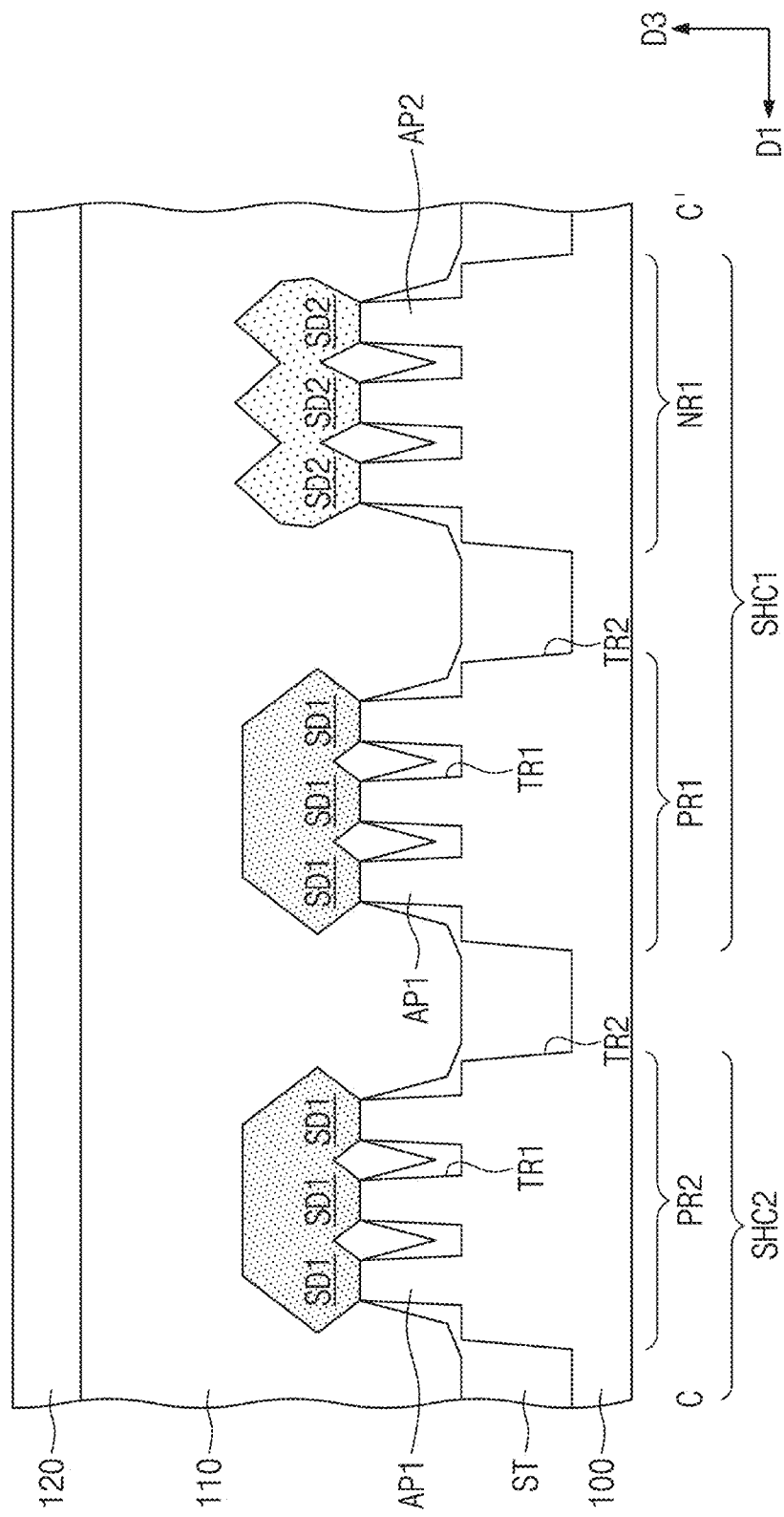
Figure 11D:
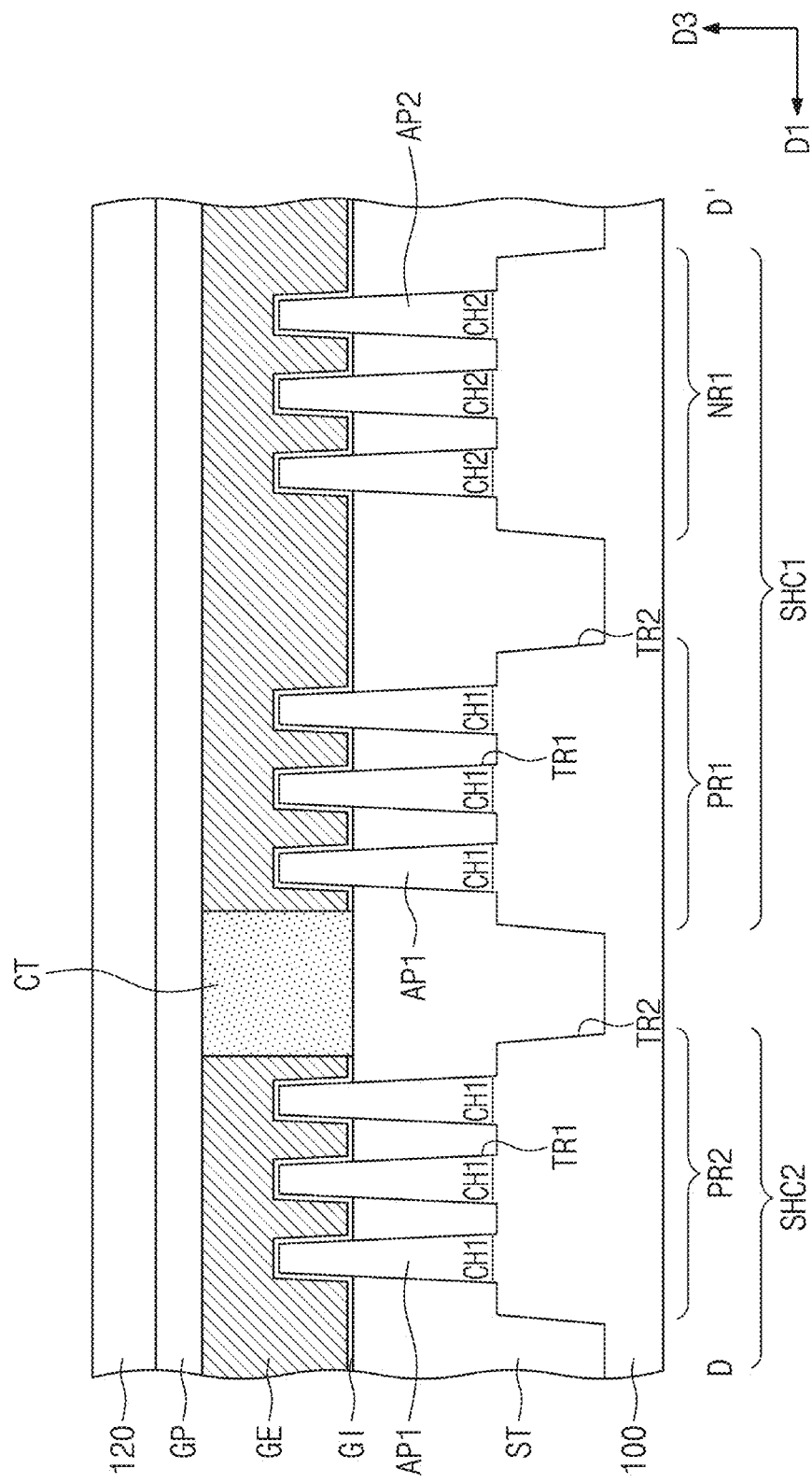
Figure 12:
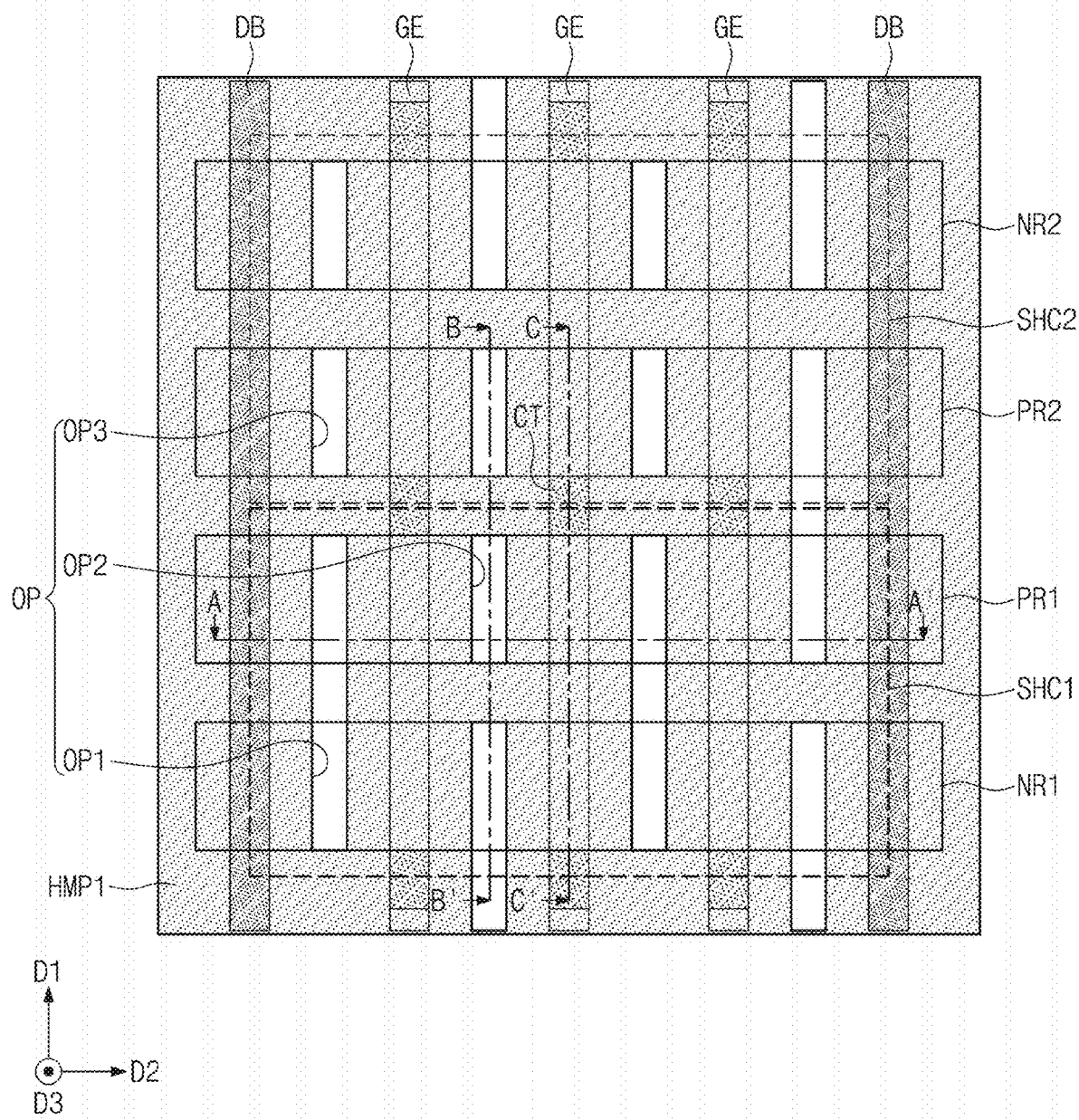
Figure 13A:
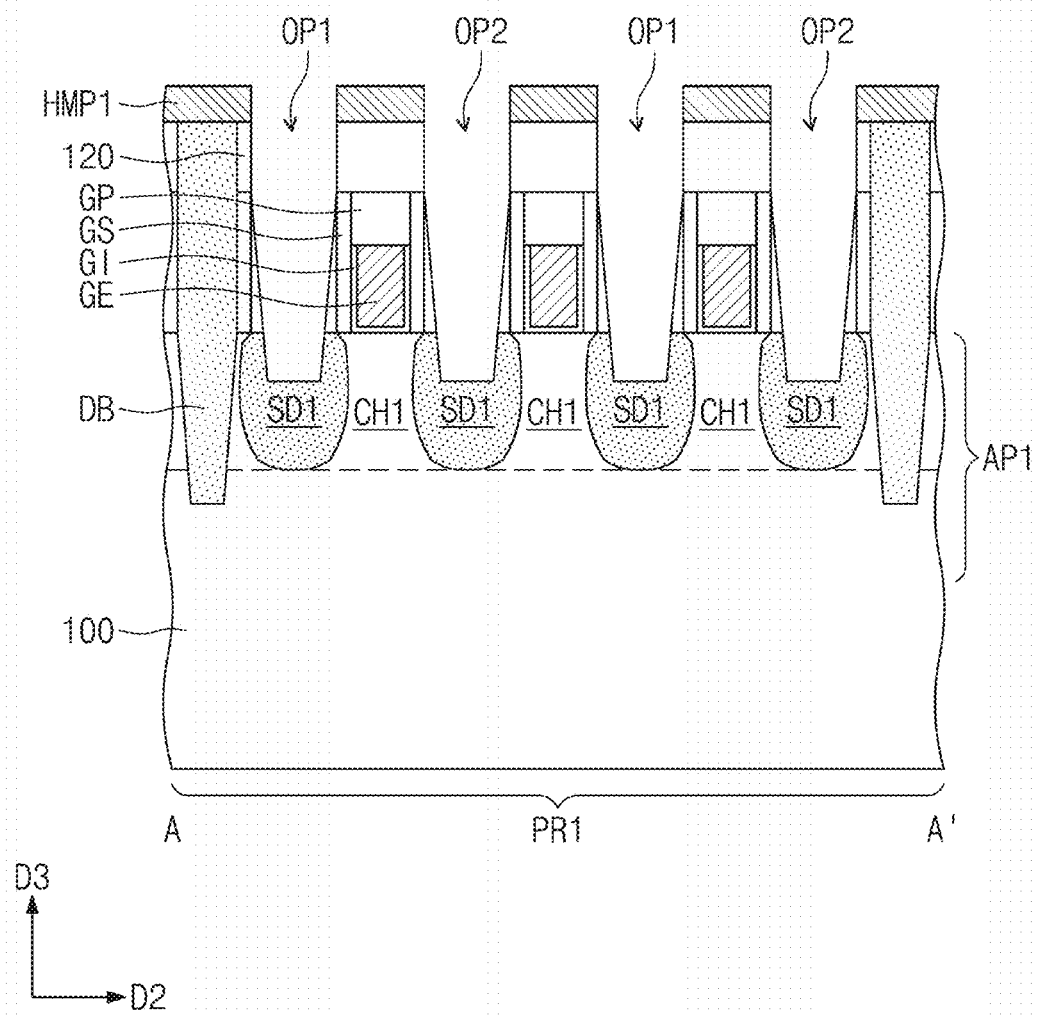
Figure 13B:
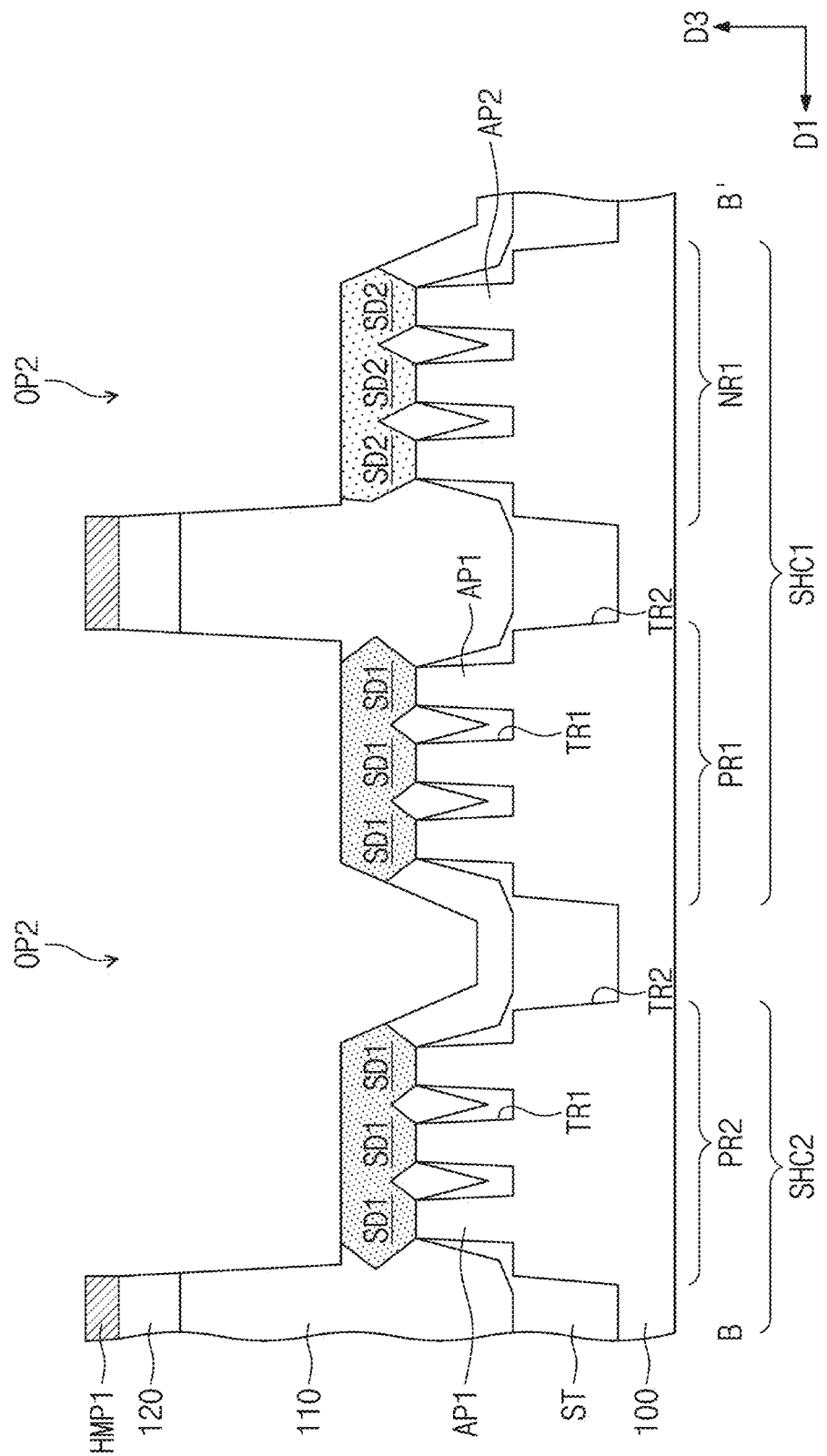
Figure 13C:
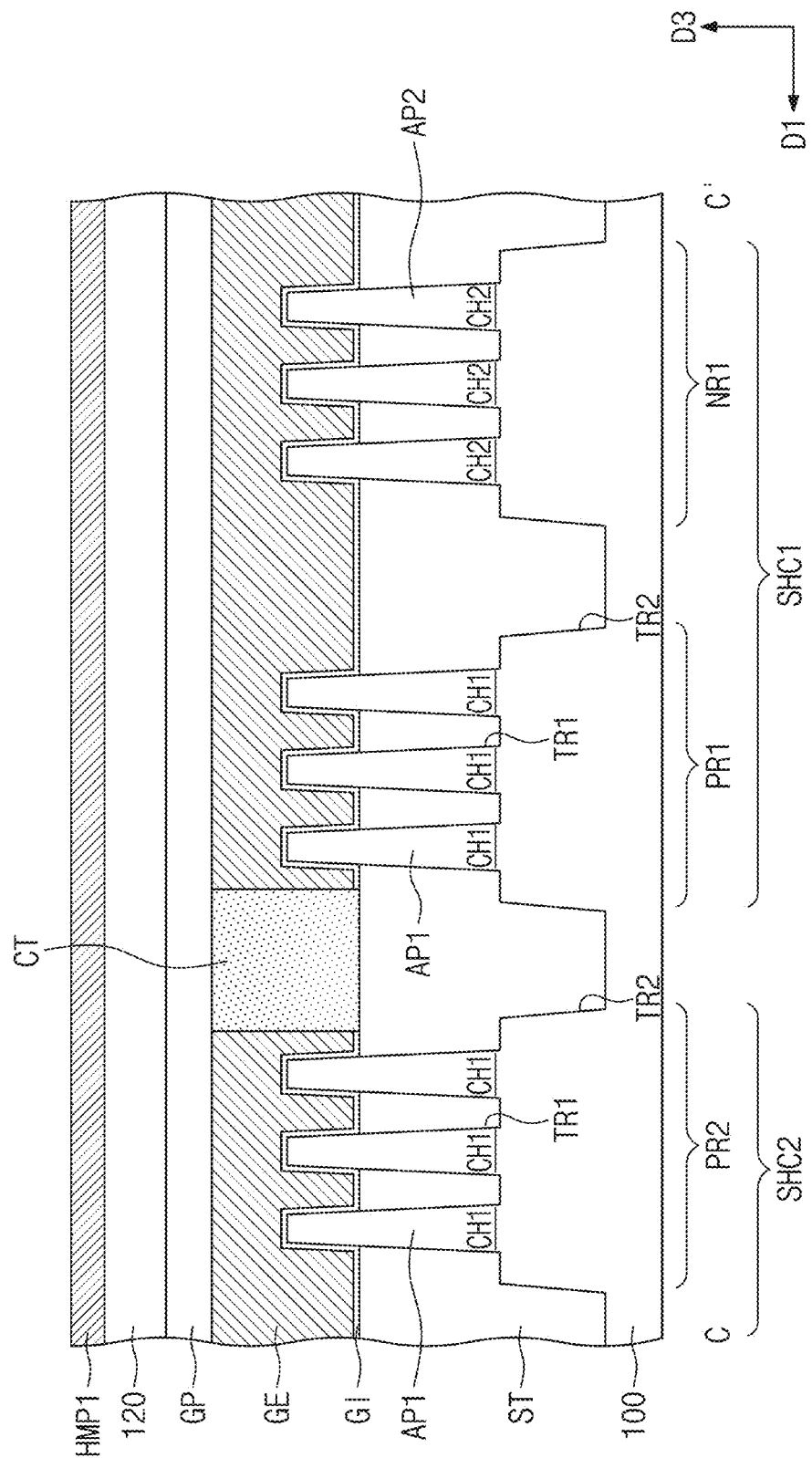
Figure 14:
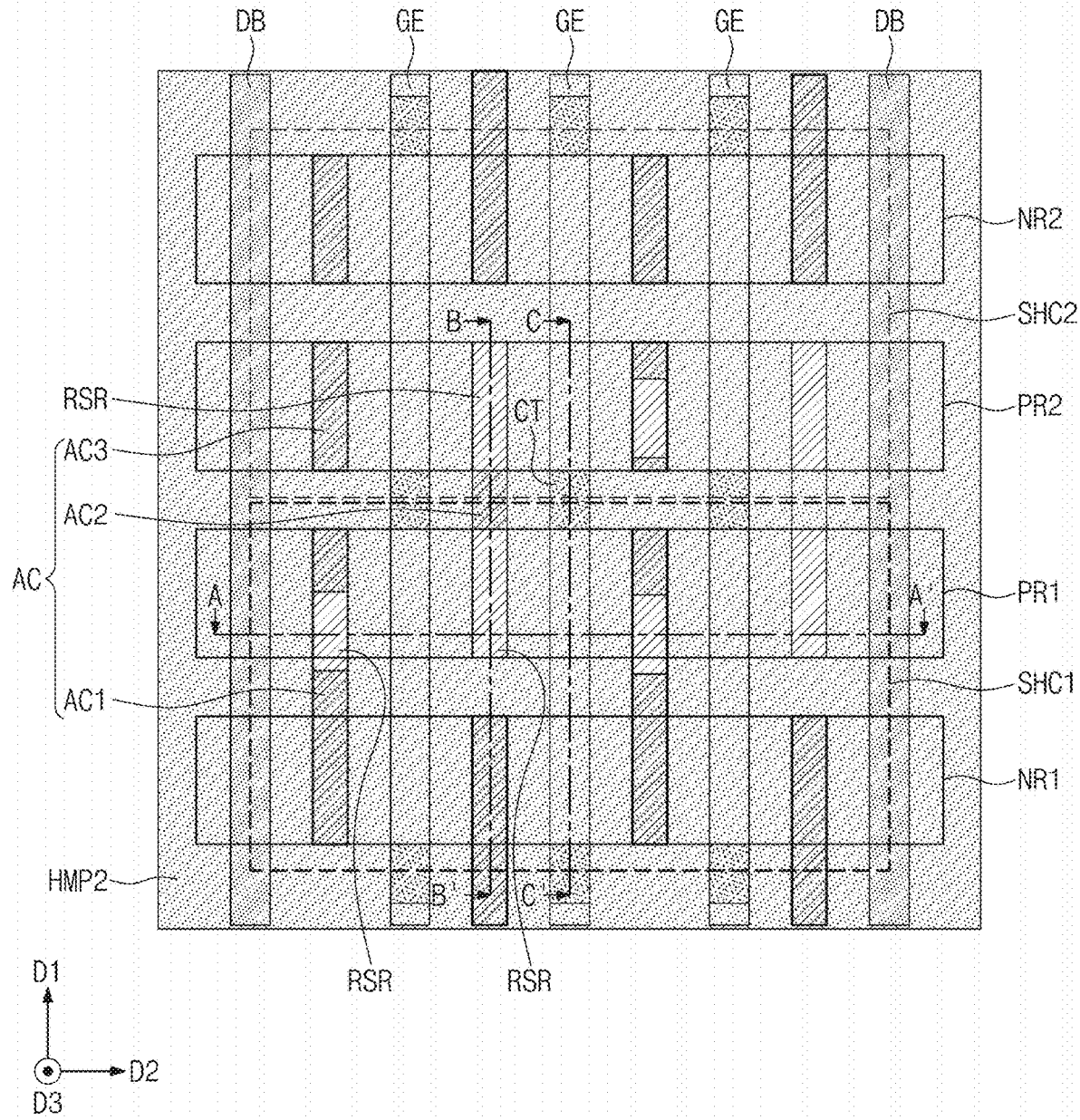
Figure 15A:
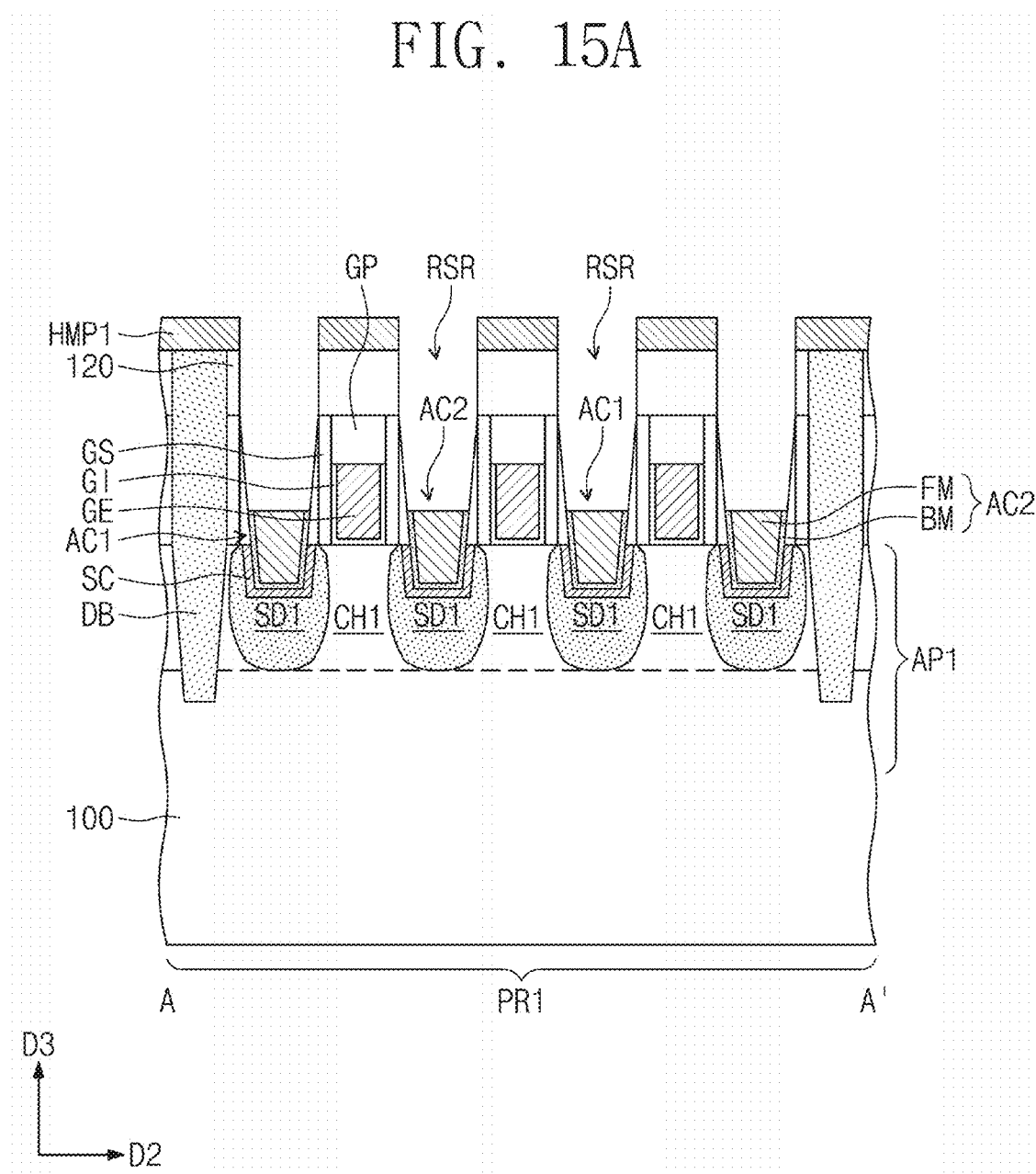
Figure 15B:
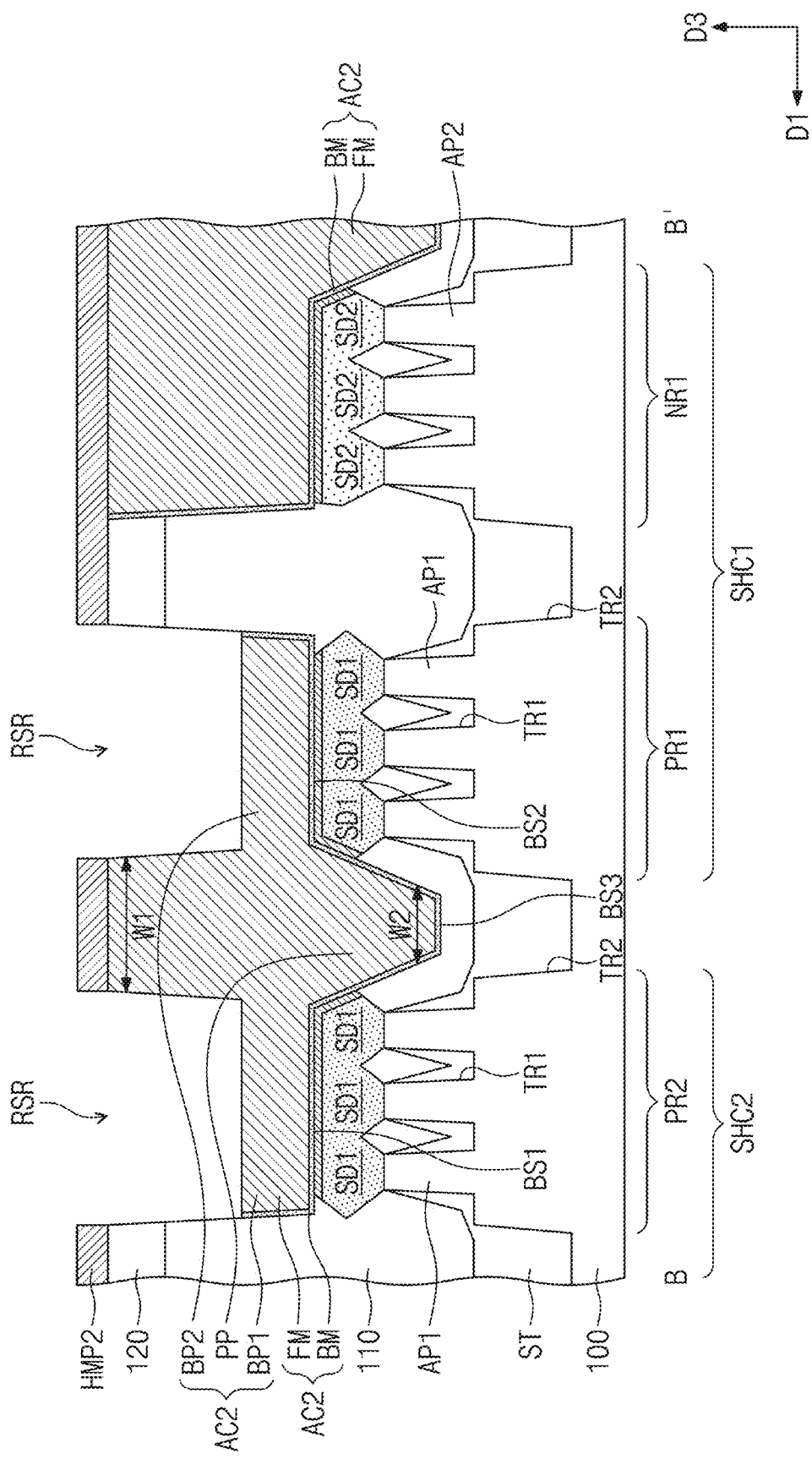
Figure 15C:
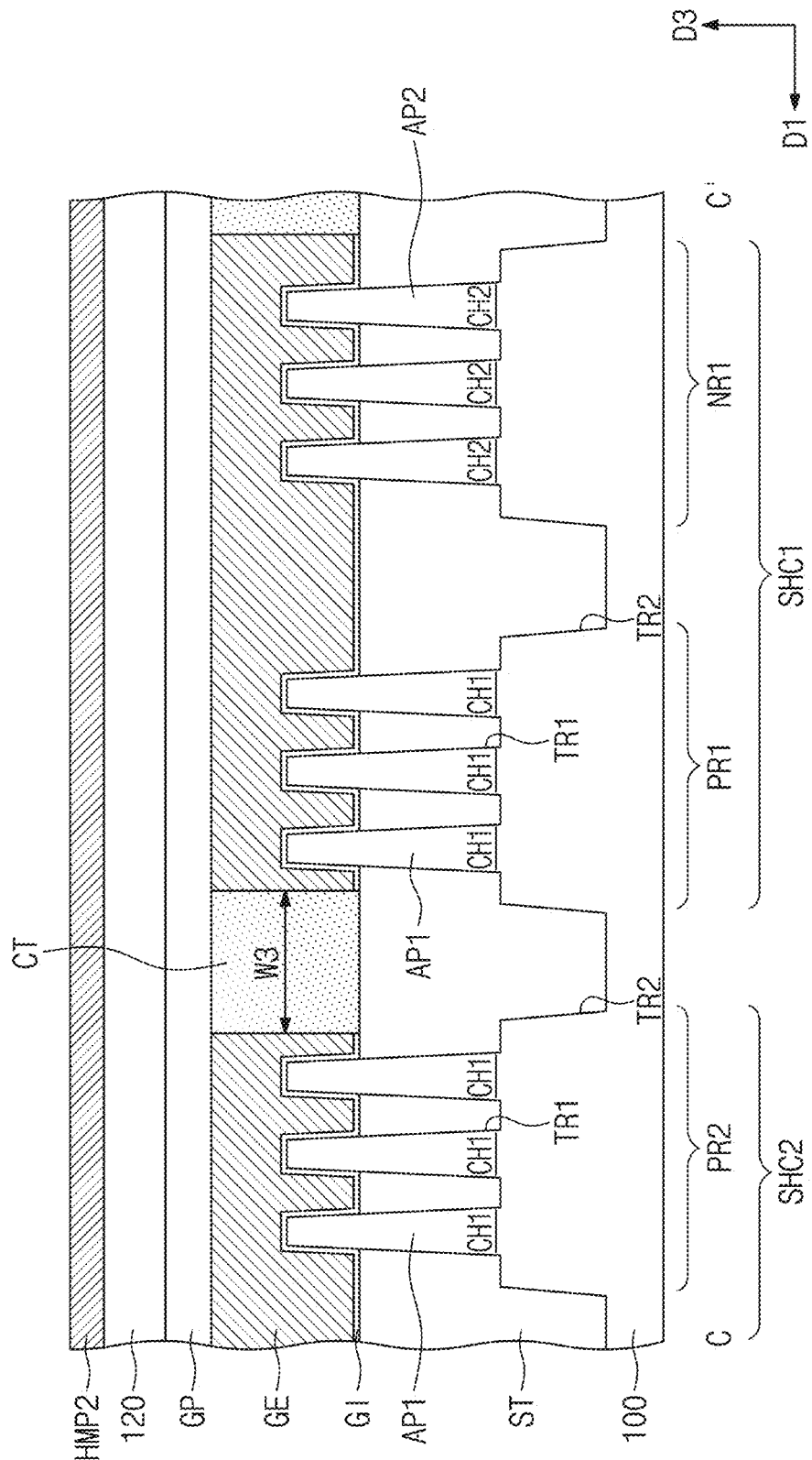

FIGS. 8, 10, 12, and 14 illustrate plan views showing a method of fabricating a semiconductor device according to some example embodiments of inventive concepts. FIGS. 9A, 11A, 13A, and 15A illustrate cross-sectional views taken along line A-A' of FIGS. 8, 10, 12, and 14, respectively. FIGS. 9B, 11B, 13B, and 15B illustrate cross-sectional views taken along line B-B' of FIGS. 8, 10, 12, and 14, respectively. FIGS. 9C, 11C, 13C, and 15C illustrate cross-sectional views taken along line C-C' of FIGS. 8, 10, 12, and 14, respectively. FIGS. 9D and 11D illustrate cross-sectional views taken along line D-D' of FIGS. 8 and 10, respectively.

Referring to FIGS. 8 and 9A to 9D, a substrate 100 may be provided which includes a first PMOSFET region PR1, a second PMOSFET region PR2, a first NMOSFET region NR1, and a second NMOSFET region NR2. The first NMOSFET region NR1 and the first PMOSFET region PR1 may define a first single height cell SHC1, and the second NMOSFET region NR2 and the second PMOSFET region PR2 may define a second single height cell SHC2.

The substrate 100 may be patterned to form first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2.

A device isolation layer ST may be formed on the substrate 100. The device isolation layer ST may include a dielectric material, such as a silicon oxide layer. The device isolation layer ST may be recessed until an upper portion of each of the first and second active patterns AP1 and AP2 is exposed. Therefore, the first and second active patterns AP1 and AP2 may have their upper portions that vertically protrude upwardly from the device isolation layer ST.

Sacrificial patterns SAP may be formed to run across the first and second active patterns AP1 and AP2. The sacrificial patterns SAP may be formed to have a linear or bar shape that extends in a first direction D1.

For example, the formation of the sacrificial patterns SAP may include forming a sacrificial layer on an entire surface of the substrate 100, forming mask patterns MA on the sacrificial layer, and using the mask patterns MA as an etching mask to pattern the sacrificial layer. The sacrificial layer may include polysilicon.

A pair of gate spacers GS may be formed on opposite sidewalls of each of the sacrificial patterns SAP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

First source/drain patterns SD1 may be formed on an upper portion of each of the first active patterns AP1. A pair of first source/drain patterns SD1 may be formed on opposite sides of each of the sacrificial patterns SAP.

For example, the mask patterns MA and the gate spacers GS may be used as an etching mask to etch the upper portion of the first active pattern AP1 to form first recesses. While the upper portion of the first active pattern AP1 is etched, the device isolation layer ST may be recessed between the first active patterns AP1 (see FIG. 9C).

The first source/drain pattern SD1 may be formed by performing a selective epitaxial process in which an inner wall of the first recess of the first active pattern AP1 is used as a seed layer. The formation of the first source/drain patterns SD1 may define a first channel pattern CH1 between a pair of first source/drain patterns SD1. For example, the selective epitaxial growth process may include a chemical vapor deposition (CVD) process or a molecular beam epitaxy (MBE) process. The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ implanted during the selective epitaxial growth process for the formation of the first source/drain patterns SD1. For another example, after the first source/drain patterns SD1 are formed, the first source/drain patterns SD1 may be implanted with impurities. The first source/drain patterns SD1 may be doped to have a first conductivity type (e.g., p-type).

Second source/drain patterns SD2 may be formed on the upper portion of the second active pattern AP2. A pair of second source/drain patterns SD2 may be formed on opposite sides of each of the sacrificial patterns SAP.

For example, the mask patterns MA and the gate spacers GS may be used as an etching mask to etch the upper portion of the second active pattern AP2 to form second recesses. The second source/drain pattern SD2 may be formed by performing a selective epitaxial process in which an inner wall of the second recess of the second active pattern AP2 is used as a seed layer. The formation of the second source/drain patterns SD2 may define a second channel pattern CH2 between a pair of the second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 10 and 11A to 11D, a first interlayer dielectric layer 110 may be formed to cover the first and second source/drain patterns SD1 and SD2, the mask patterns MA, and the gate spacers GS. For example, the first interlayer dielectric layer 110 may include a silicon oxide layer.

The first interlayer dielectric layer 110 may be planarized until top surfaces of the sacrificial patterns SAP are exposed. An etch-back or chemical mechanical polishing (CMP) process may be employed to planarize the first interlayer dielectric layer 110. The mask patterns MA may all be removed during the planarization process. As a result, the first interlayer dielectric layer 110 may have a top surface substantially coplanar with those of the sacrificial patterns SAP and those of the gate spacers GS.

The sacrificial patterns SAP may be replaced with corresponding gate electrodes GE. For example, the exposed sacrificial patterns SAP may be selectively removed. The removal of the sacrificial patterns SAP may form empty spaces. A gate dielectric pattern GI, a gate electrode GE, and a gate capping pattern GP may be formed in each of the empty spaces. The gate electrode GE may include a first metal pattern and a second metal pattern on the first metal pattern. The first metal pattern may be formed of a work function metal capable of controlling a threshold voltage of a transistor, and the second metal pattern may be formed of metal whose resistance is low.

While the sacrificial pattern SAP is replaced with the gate electrode GE, gate cutting patterns CT may be formed on the gate electrode GE. The gate cutting patterns CT may divide a single gate electrode GE into a plurality of gate electrodes GE.

A second interlayer dielectric layer 120 may be formed on the first interlayer dielectric layer 110. The second interlayer dielectric layer 120 may include a silicon oxide layer. A pair of separation structures DB may be formed on opposite sides of the first single height cell SHC1. The separation structures DB may be formed to overlap the gate electrodes GE formed on the opposite sides of the first single height cell SHC1. For example, the formation of the separation structures DB may include forming a hole that penetrates the first and second interlayer dielectric layers 110 and 120 and extends into the first and second active patterns AP1 and AP2, and then filling the hole with a dielectric layer.

Referring to FIGS. 12 and 13A to 13C, a first hardmask pattern HMP1 may be formed on the second interlayer dielectric layer 120. A photolithography process may be employed to form a plurality of openings OP in the first hardmask pattern HMP1. The first hardmask pattern HMP1 may include a metal nitride layer (e.g., a titanium nitride layer).

The openings OP of the first hardmask pattern HMP1 may include a first opening OP1, a second opening OP2, and a third opening OP3. The first, second, and third openings OP1, OP2, and OP3 may correspondingly define the first, second, and third active contacts AC1, AC2, and AC3 discussed above with reference to FIG. 4.

A first etching process may be performed on the substrate 100. The first etching process may be an anisotropic etching process. The first etching process may etch the second interlayer dielectric layer 120 exposed to the openings OP. The first etching process may etch the second interlayer dielectric layer 120 exposed to the openings OP. The first etching process may continue until the first and second source/drain patterns SD1 and SD2 are exposed. The first etching process may etch an upper portion of each of the first and second source/drain patterns SD1 and SD2.

Referring back to FIG. 13B, when the first etching process is performed, an over-etching may be carried out to remove the upper portion of each of the first and second source/drain patterns SD1 and SD2 such that the first interlayer dielectric layer 110 between the first and second source/drain patterns SD1 and SD2 may be recessed deeper than the first and second source/drain patterns SD1 and SD2. For example, a lowermost level of the second opening OP2 may be lower than a level of a top surface of each of the first and second source/drain patterns SD1 and SD2. In this case, the second opening OP2 may have a profile which corresponds to that of the second active contact AC2 discussed with reference to FIG. 5D.

For another example, the second opening OP2 may have a profile which corresponds to that of the second active contact AC2 discussed with reference to FIG. 6B. In more detail, during the formation of the openings OP, an etch selectivity of impurities (e.g., silicon nitride) that remain on the first and second interlayer dielectric layers 110 and 120 may cause the second opening OP2 to have a profile which corresponds to that of the second active contact AC2 discussed with reference to FIG. 6B.

Referring to FIGS. 14 and 15A to 15C, the openings OP may be filled with a conductive material to form active contacts AC. For example, each of first and second active contacts AC1 and AC2 may include a first body BP1, a second body BP2, and a protrusion PP between the first and second bodies BP1 and BP2.

For another example, as shown in FIGS. 6A and 6B, each of first and second active contacts AC1 and AC2 may include a first body BP1, a second body BP2, a first protrusion PP1 and a second protrusion PP2 that are provided between the first and second bodies BP1 and BP2, and a recession RP between the first and second protrusions PP1 and PP2.

A second hardmask pattern HMP2 may be formed on the second interlayer dielectric layer 120. A photolithography process may be employed to form a plurality of open regions (not shown) on the second hardmask pattern HMP2. The second hardmask pattern HMP2 may include a metal nitride layer (e.g., a titanium nitride layer).

The open regions (not shown) of the second hardmask pattern HMP2 may define the upper dielectric patterns UIP discussed above with reference to FIGS. 4 and 5A to 5E.

A second etching process may be performed on the substrate 100. The second etching process may etch an upper portion of the active contact AC exposed to the open regions (not shown) of the second hardmask pattern HMP2. The second etching process may form recess regions RSR on the upper portion of the active contact AC.

For example, two recess regions RSR may be formed on an upper portion of the second active contact AC2. Each of the recess regions RSR formed on the upper portion of the second active contact AC2 may be formed on the first PMOSFET region PR1 of the first single height cell SHC1 and the second PMOSFET region PR2 of the second single height cell SHC2.

The second active contact AC2 may have a first width W1 or a minimum width at its portion interposed between neighboring recess regions RSR. The protrusion PP may have a second width W2 as a minimum width thereof. The gate cutting pattern CT may have a third width W3 as a width thereof (see FIG. 15C). The first width W1 and the third width W3 may be substantially the same as each other. For example, a ratio of the first width W1 to the third width W3 may range from about 0.8 to about 1.2. The second width W2 may be less than the third width W3.

Referring back to FIGS. 4 and 5A to 5E, the recess regions RSR may be filled with a dielectric material to form upper dielectric patterns UIP. The width of the gate cutting pattern CT may substantially correspond to the minimum width at the portion of the second active contact AC2, which portion is interposed between neighboring upper dielectric patterns UIP. The second active contact AC2 may thus be limited and/or prevented from being cut-off due to the upper dielectric patterns UIP. As a result, a semiconductor device may increase in electrical characteristics.

Gate contacts GC may be formed to penetrate the second interlayer dielectric layer 120 and the gate capping pattern GP and to have electrical connections with corresponding gate electrodes GE.

A third interlayer dielectric layer 130 may be formed on the second interlayer dielectric layer 120. A first metal layer M1 may be formed in the third interlayer dielectric layer 130. The formation of the first metal layer M1 may include forming a first power line M1_R1, a second power line M1_R2, a third power line M1_R3, and first wiring lines M1_I.

A fourth interlayer dielectric layer 140 may be formed on the first metal layer M1. A second metal layer M2 may be formed in the fourth interlayer dielectric layer 140. The formation of the second metal layer M2 may include forming second wiring lines M2_I. For example, the second wiring lines M2_I may be formed by a dual damascene process.

Figure 16:
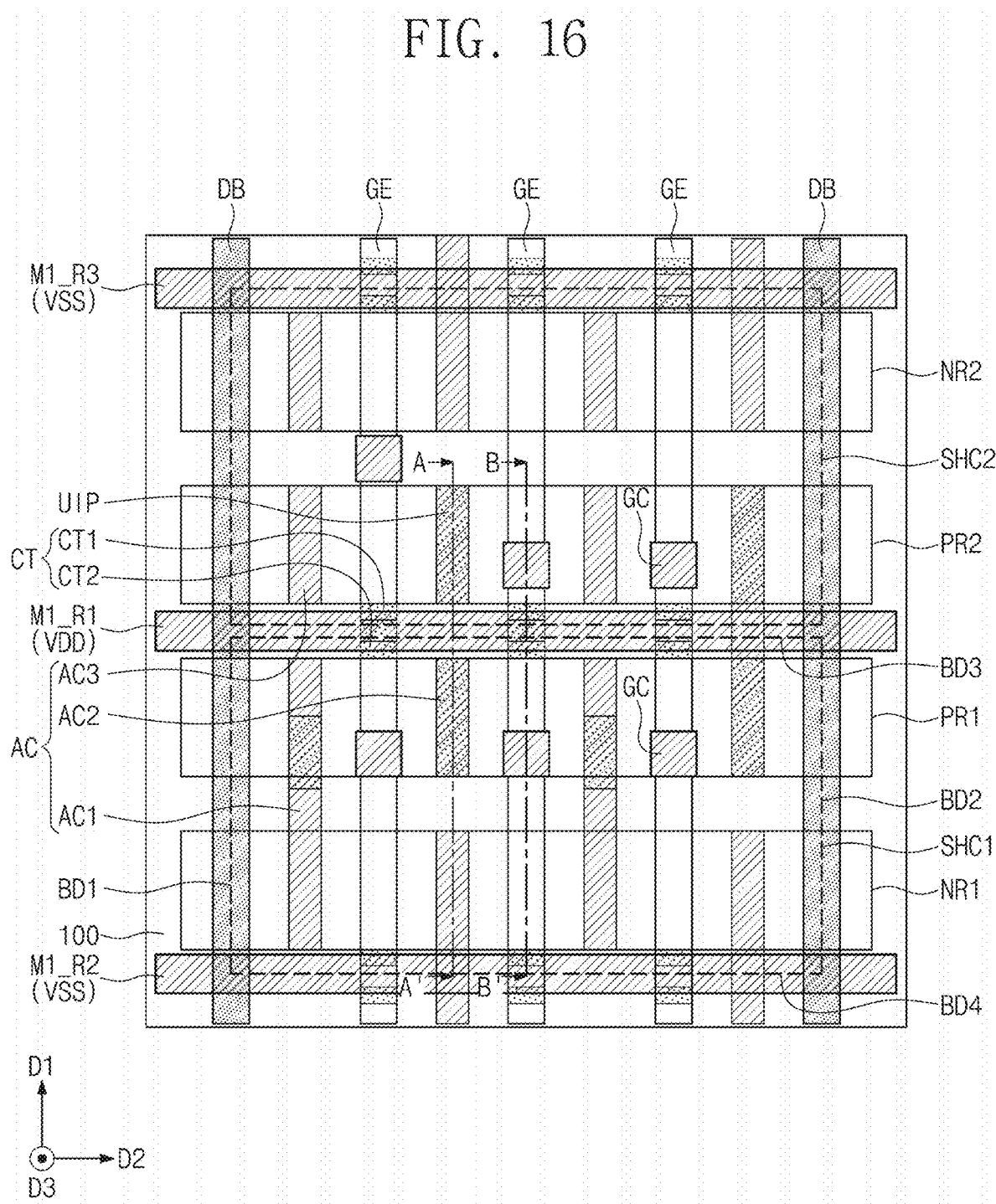
FIG. 16 illustrates a plan view showing a semiconductor device according to some example embodiments of inventive concepts.
Figure 17A:
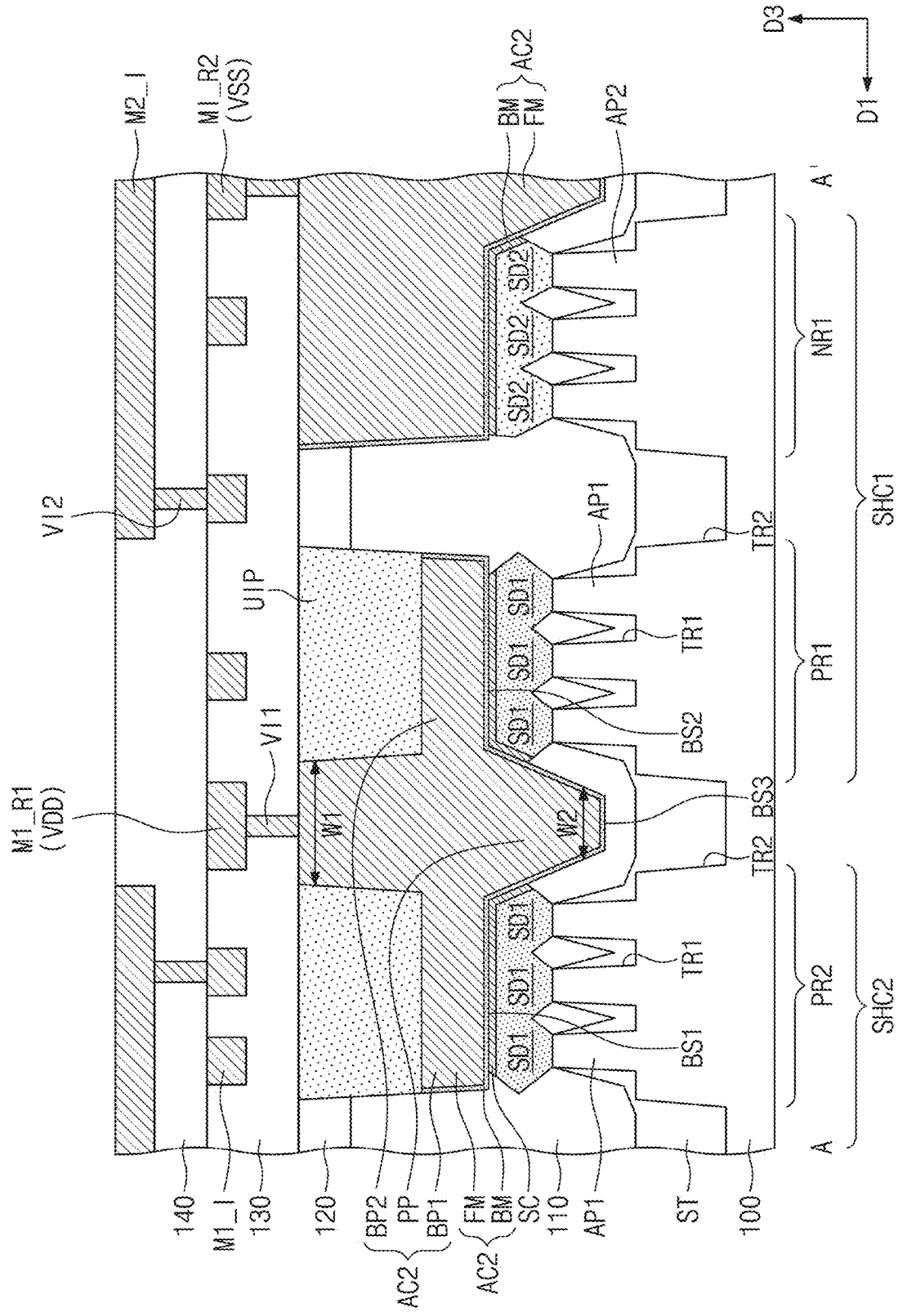
FIGS. 17A and 17B illustrate cross-sectional views respectively taken along lines A-A' and B-B' of FIG. 16.
Figure 17B:
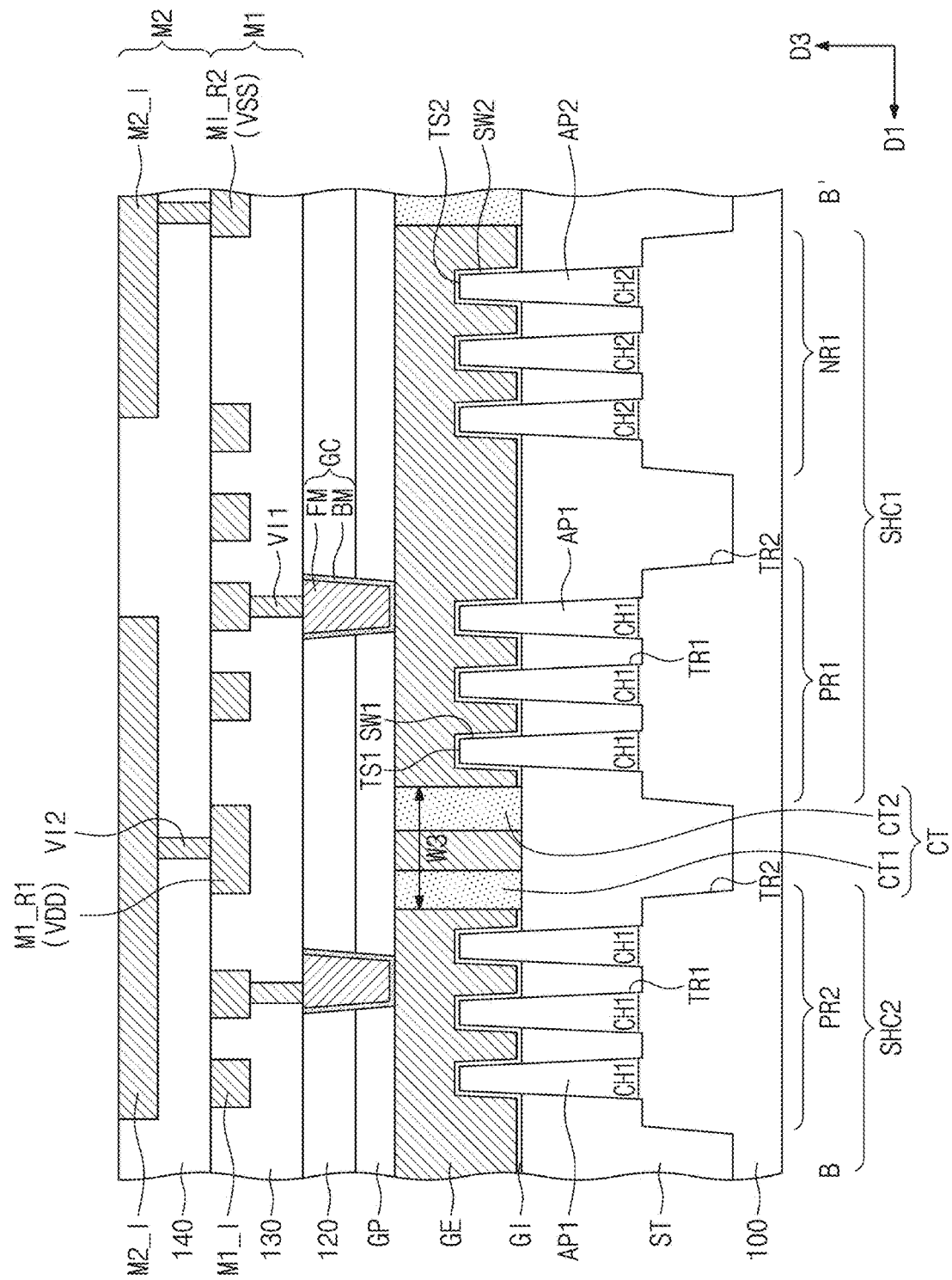

FIG. 16 illustrates a plan view showing a semiconductor device according to some example embodiments of inventive concepts. FIGS. 17A and 17B illustrate cross-sectional views respectively taken along lines A-A' and B-B' of FIG. 16. In the embodiment that follows, a detailed description of technical features repetitive to those discussed above with reference to FIGS. 4 and 5A to 5D will be omitted, and a difference thereof will be discussed in detail.

Referring to FIGS. 16, 17A, and 17B, each of the gate cutting patterns CT may include a first gate cutting pattern CT1 and a second gate cutting pattern CT2 that are spaced apart from each other in the first direction D1. A portion of the gate electrode GE may be interposed between the first and second gate cutting patterns CT1 and CT2. The first and second gate cutting patterns CT1 and CT2 may be aligned with each other in the first direction D1. Each of the first, second, and third power lines M1_R1, M1_R2, and M1_R3 may vertically overlap the first and second gate cutting patterns CT1 and CT2.

Referring to FIGS. 17A and 17B, the second active contact AC2 may have a first width W1 or a minimum width at its portion interposed between neighboring upper dielectric patterns UIP. The protrusion PP may have a second width W2 as a minimum width thereof. The gate cutting pattern CT may have a third width W3 as a width thereof. The width (or the third width W3) of the gate cutting pattern CT may be a maximum width between one sidewall of the first gate cutting pattern CT1 and one sidewall of the second gate cutting pattern CT2. The first width W1 may be substantially the same as the third width W3. For example, a ratio of the first width W1 to the third width W3 may range from about 0.8 to about 1.2. The second width W2 may be less than the third width W3.

FIGS. 18A, 18B, 18C, and 18D illustrate cross-sectional views respectively taken along lines A-A', B-B', D-D', and E-E' of FIG. 4, showing a semiconductor device according to some example embodiments of inventive concepts. In the embodiment that follows, a detailed description of technical features repetitive to those discussed above with reference to FIGS. 4 and 5A to 5D will be omitted, and a difference thereof will be discussed in detail.

Referring to FIGS. 4 and 18A to 18D, a substrate 100 may be provided which includes a first PMOSFET region PR1, a second PMOSFET region PR2, a first NMOSFET region NR1, and a second NMOSFET region NR2. A device isolation layer ST may be provided on the substrate 100. The device isolation layer ST may define a first active pattern AP1 and a second active pattern AP2 on an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The first active pattern AP1 may include first channel patterns CH1 that are vertically stacked. The stacked first channel patterns CH1 may be spaced apart from each other in a third direction D3. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include at least one selected from silicon (Si), germanium (Ge), and silicon-germanium (SiGe).

The first active pattern AP1 may further include first source/drain patterns SD1. The stacked first channel patterns CH1 may be interposed between a pair of neighboring first source/drain patterns SD1. The stacked first channel patterns CH1 may connect the pair of neighboring first source/drain patterns SD1 to each other.

The second active pattern AP2 may further include second source/drain patterns SD2. The stacked second channel patterns CH2 may be interposed between a pair of neighboring second source/drain patterns SD2. The stacked second channel patterns CH2 may connect the pair of neighboring second source/drain patterns SD2 to each other.

Gate electrodes GE may be provided to extend in a first direction D1, while running across the first and second channel patterns CH1 and CH2. The gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

Figure 18A:
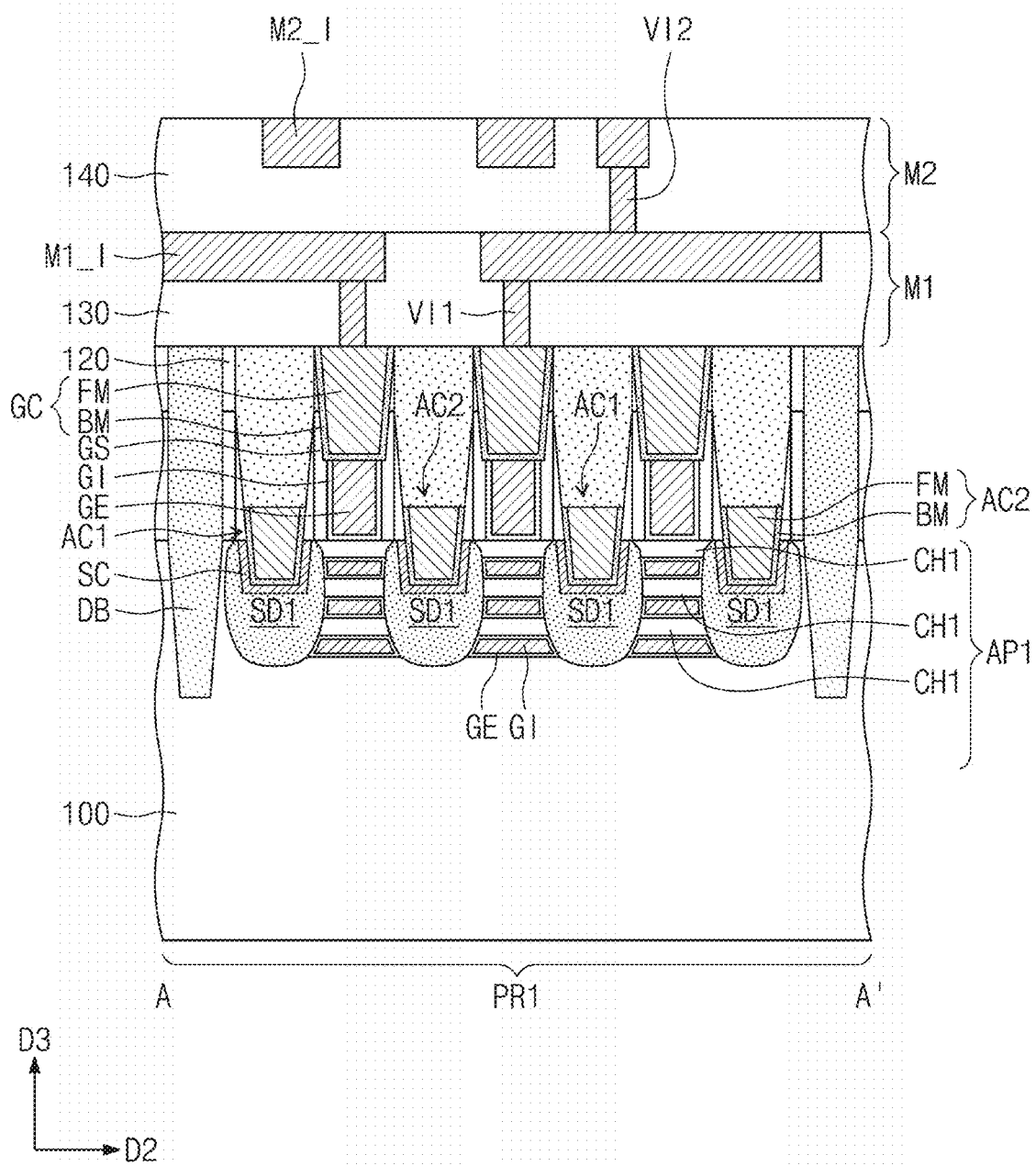
FIGS. 18A, 18B, 18C, and 18D illustrate cross-sectional views respectively taken along lines A-A', B-B', D-D', and E-E' of FIG. 4, showing a semiconductor device according to some example embodiments of inventive concepts.
Figure 18B:
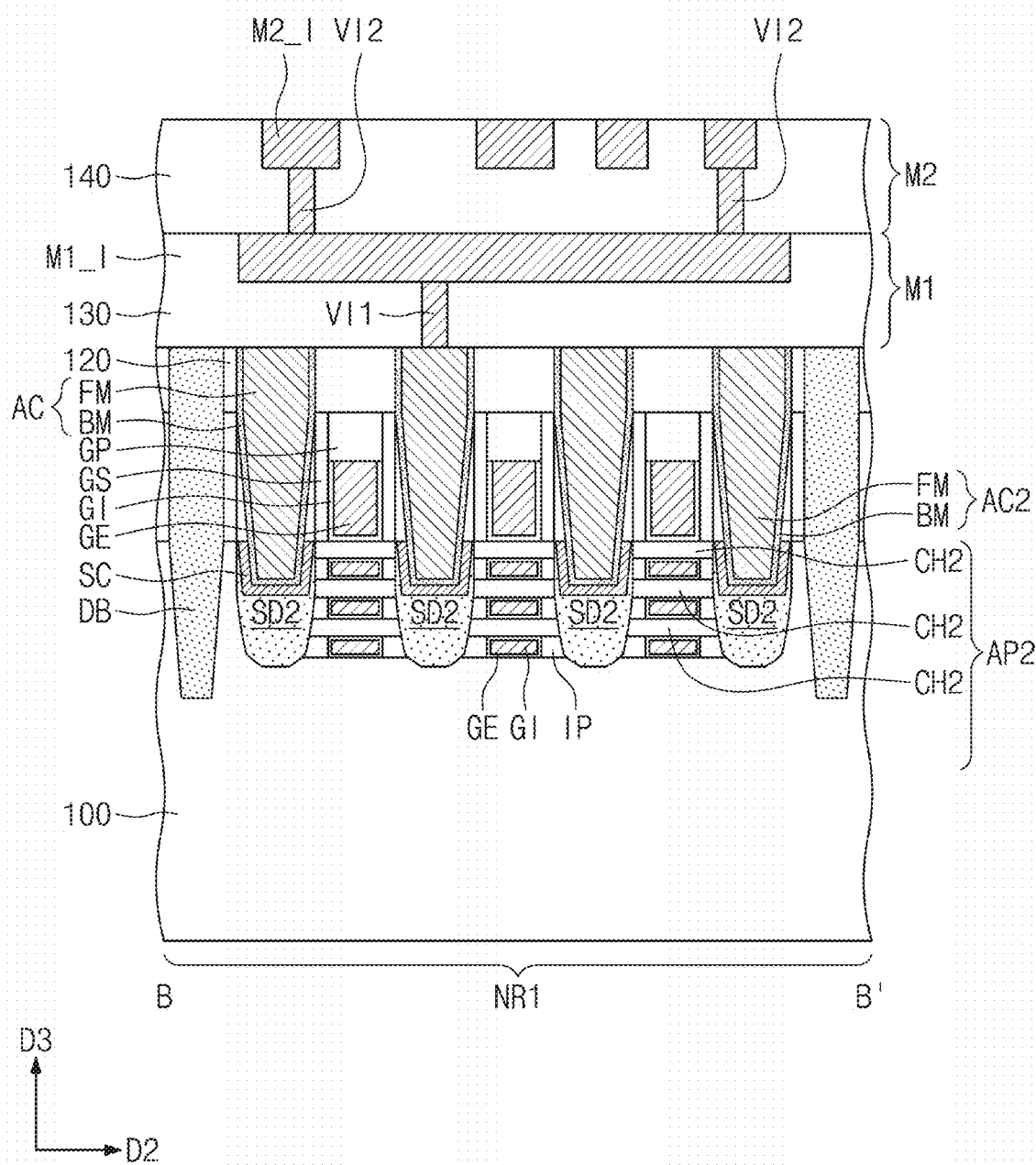
Figure 18C:
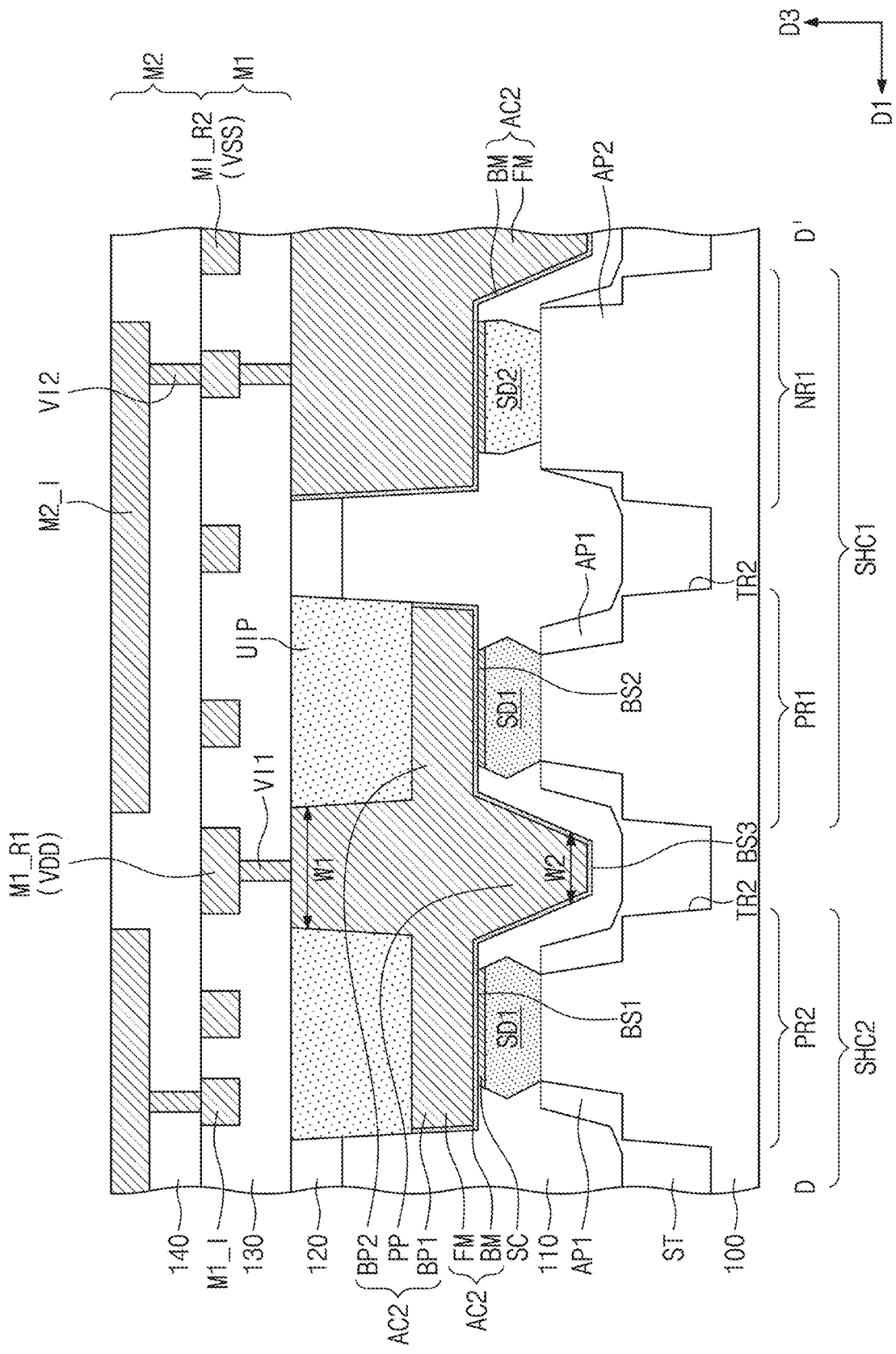
Figure 18D:
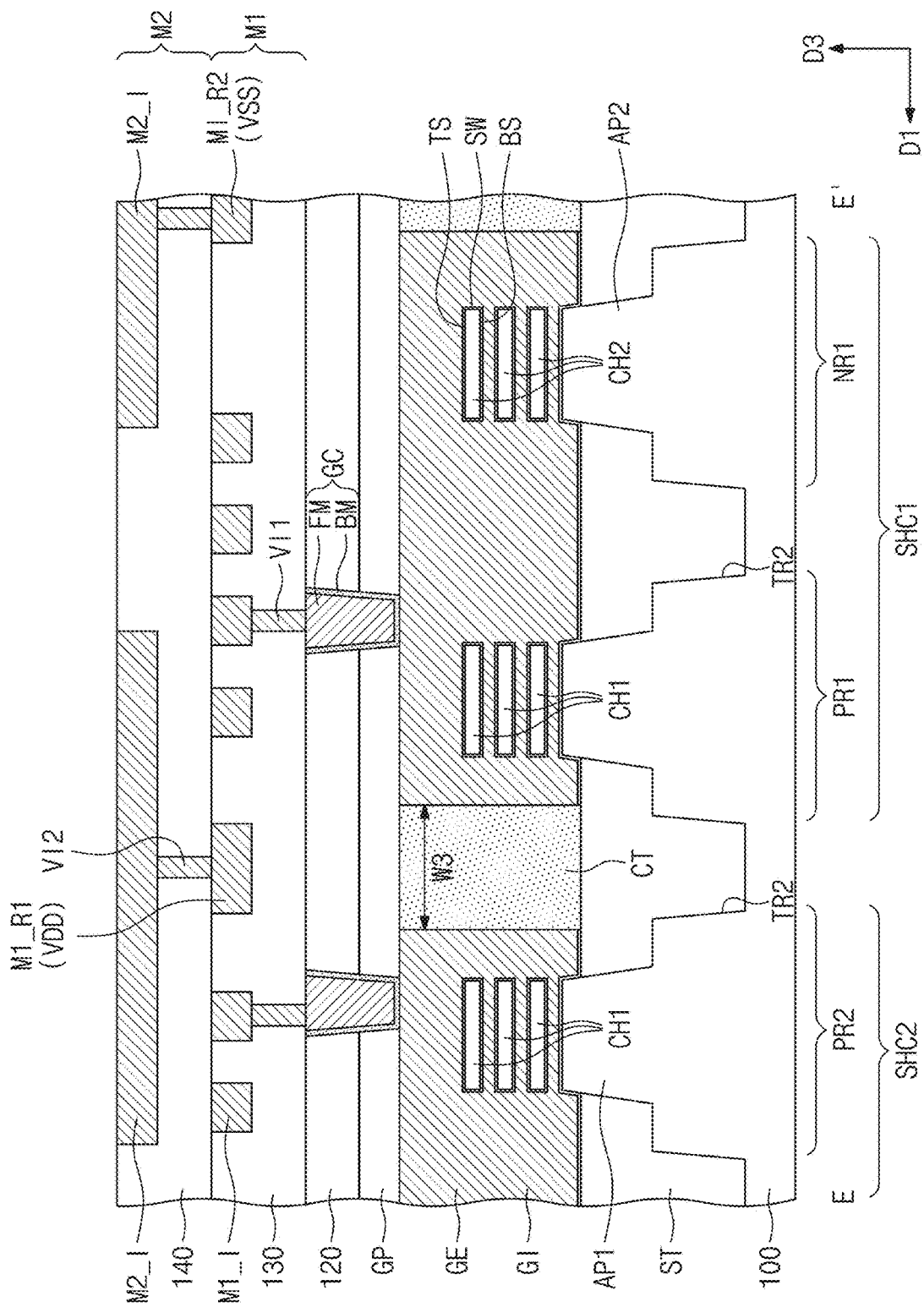

The gate electrode GE may surround each of the first and second channel patterns CH1 and CH2 (see FIG. 18D). The gate electrode GE may be provided on a top surface TS, at least one sidewall SW, and a bottom surface BS of each of the first and second channel patterns CH1 and CH2. For example, the gate electrode GE may surround the top surface TS, the bottom surface BS, and the opposite sidewalls SW of each of the first and second channel patterns CH1 and CH2. A transistor according to the present embodiment may be a three-dimensional field effect transistor (e.g., MBCFET) in which the gate electrode GE three-dimensionally surrounds the first and second channel patterns CH1 and CH2.

Gate cutting patterns CT may divide the gate electrode GE extending in the first direction D1 into a plurality of gate electrodes GE.

A gate dielectric pattern GI may be provided between the gate electrode GE and each of the first and second channel patterns CH1 and CH2. The gate dielectric pattern GI may surround each of the first and second channel patterns CH1 and CH2.

On the first and second NMOSFET regions NR1 and NR2, a dielectric pattern IP may be interposed between the gate dielectric pattern GI and the second source/drain pattern SD2. The gate dielectric pattern GI and the dielectric pattern IP may separate the gate electrode GE from the second source/drain pattern SD2. In contrast, the dielectric pattern IP may be omitted from the first and second PMOSFET regions PR1 and PR2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connections with the first and second source/drain patterns SD1 and SD2. Gate contacts GC may be provided to penetrate the second interlayer dielectric layer 120 and the gate capping pattern GP and to have connections with corresponding gate electrodes GE.

For example, a second active contact AC2 may include a first body BP1, a second body BP2, and a protrusion PP between the first and second bodies BP1 and BP2. Although not shown, the protrusion PP may extend along an inclined sidewall of the first source/drain pattern SD1 and toward the device isolation layer ST. The second active contact AC2 may include upper dielectric patterns UIP spaced apart from each other in the first direction D1 on an upper portion of the second active contact AC2. A detailed description of the active contacts AC and the gate contacts GC may be substantially the same as that discussed above with reference to FIGS. 4 and 5A to 5E or to FIGS. 6A and 6B.

The second contact AC2 may have a first width W1 or a minimum width in the first direction D1 at its portion interposed between neighboring upper dielectric patterns UIP. The protrusion PP may have a second width W2 or a minimum width in the first direction D1. The gate cutting pattern CT may have a third width W3 or a width in the first direction D1. The first width W1 may be substantially the same as the third width W3. For example, a ratio of the first width W1 to the third width W3 may range from about 0.8 to about 1.2. The second width W2 may be less than the third width W3.

A third interlayer dielectric layer 130 may be provided on the second interlayer dielectric layer 120. A fourth interlayer dielectric layer 140 may be provided on the third interlayer dielectric layer 130. A first metal layer M1 may be provided in the third interlayer dielectric layer 130. A second metal layer M2 may be provided in the fourth interlayer dielectric layer 140. A detailed description of the first metal layer M1 and the second metal layer M2 may be substantially the same as that discussed above with reference to FIGS. 4 and 5A to 5E.

A semiconductor device according to inventive concepts may be configured such that an active contact has a width at its portion interposed between neighboring upper dielectric patterns, and that the width of the portion of the active contact is substantially the same as a width of a gate cutting pattern. Therefore, the active contact may be limited and/or prevented from being cut-off due to the upper dielectric patterns. As a result, the semiconductor device may increase in electrical characteristics.

Although inventive concepts have been described in connection with the some example embodiments of inventive concepts illustrated in the accompanying drawings, it will be understood by one of ordinary skill in the art that variations in form and detail may be made therein without departing from the spirit and essential feature of inventive concepts. The above disclosed embodiments should thus be considered illustrative and not restrictive.

What is claimed is:

1. A semiconductor device, comprising:
a substrate including a first active region and a second active region that are spaced apart from each other in a first direction;
a device isolation layer on the substrate, the device isolation layer defining a first active pattern on the first active region and a second active pattern on the second active region;
a first gate electrode and a second gate electrode that run across the first active region and the second active region, the first gate electrode and the second gate electrode being aligned with each other in the first direction;
a first source/drain pattern and a second source/drain pattern on each of the first active pattern and the second active pattern;
a first active contact that extends in the first direction and connects the first source/drain pattern and the second source/drain pattern to each other; and
a gate cutting pattern between the first gate electrode and the second gate electrode,
wherein an upper portion of the first active contact includes a first upper dielectric pattern on the first active region and a second upper dielectric pattern on the second active region,
wherein a minimum width at a portion of the first active contact is a first width, the portion of the first active contact being between the first upper dielectric pattern and the second upper dielectric pattern,
wherein a minimum width of the gate cutting pattern is a second width, and
wherein a ratio of the first width to the second width is in a range of about 0.8 to about 1.2.

2. The semiconductor device of claim 1, further comprising:
a plurality of gate contacts correspondingly coupled to the first gate electrode and the second gate electrode,
wherein the first upper dielectric pattern and the second upper dielectric pattern are adjacent to at least one of the plurality of gate contacts.

3. The semiconductor device of claim 1, further comprising a first metal layer on the first active contact,
wherein the first metal layer includes a power line connected to the first active contact, and
wherein the power line vertically overlaps the gate cutting pattern.

4. The semiconductor device of claim 1, wherein the first active contact includes:
a first body on the first active region;
a second body on the second active region; and
a protrusion between the first body and the second body, wherein
the protrusion is on the device isolation layer between the first active region and the second active region, and
the protrusion protrudes in a direction toward the device isolation layer.

5. The semiconductor device of claim 4, wherein the protrusion extends along an inclined sidewall of the first source/drain pattern and toward the device isolation layer.

6. The semiconductor device of claim 4, wherein the first upper dielectric pattern and the second upper dielectric pattern are horizontally offset from the protrusion.

7. The semiconductor device of claim 4, wherein
a minimum width of the protrusion is a third width, and
the third width is less than the second width.

8. The semiconductor device of claim 4, wherein
the protrusion includes a first protrusion adjacent to the first body and a second protrusion adjacent to the second body,
the first active contact further includes a recession between the first protrusion and the second protrusion, and
the recession is a region where a bottom surface of the first active contact is recessed away from the device isolation layer.

9. The semiconductor device of claim 1, further comprising:
a second active contact on the first active pattern and spaced apart in a second direction from the first active contact, wherein
the second direction intersects the first direction, and
a length in the first direction of the second active contact is less than half a length in the first direction of the first active contact.

10. The semiconductor device of claim 1, wherein the gate cutting pattern includes a first gate cutting pattern and a second gate cutting pattern that are spaced apart from each other in the first direction.

11. A semiconductor device, comprising:
a substrate including a first active region of a first logic cell and a second active region of a second logic cell, the first logic cell and the second logic cell being adjacent to each other in a first direction on the substrate;
a first gate electrode and a second gate electrode that run across the first active region and the second active region;
a device isolation layer on the substrate;
a gate cutting pattern between the first gate electrode and the second gate electrode; and
an active contact that extends from the first active region toward the second active region, wherein
the active contact includes a first upper dielectric pattern, a protrusion, and a second upper dielectric pattern,
the first upper dielectric pattern and the second upper dielectric pattern are on an upper portion of the active contact and spaced apart from each other in the first direction,
the protrusion is on the device isolation layer between the first active region and the second active region,
the protrusion protrudes toward the device isolation layer, and
the first upper dielectric pattern and the second upper dielectric pattern are horizontally offset from the protrusion.

12. The semiconductor device of claim 11, wherein
a minimum width at a portion of the active contact is a first width,
the portion of the active contact is between the first upper dielectric pattern and the second upper dielectric pattern,
a minimum width of the gate cutting pattern is a second width, and
a ratio of the first width to the second width is in a range of about 0.8 to about 1.2.

13. The semiconductor device of claim 12, wherein
a minimum width of the protrusion is a third width, and
the third width is less than the second width.

14. The semiconductor device of claim 11, further comprising:
a source/drain pattern on the first active region, wherein
the protrusion extends along an inclined sidewall of the source/drain pattern, and
the protrusion extends toward the device isolation layer.

15. The semiconductor device of claim 11, wherein
the active contact includes a first body on the first active region, a second body on the second active region, and a recession,
the recession is a region of the active contact where a bottom surface of the active contact is recessed away from the device isolation layer,
the protrusion includes a first protrusion adjacent to the first body and a second protrusion adjacent to the second body, and
the recession is between the first protrusion and the second protrusion.

16. A semiconductor device, comprising:
a substrate including a first active region of a first logic cell and a second active region of a second logic cell, the first logic cell and the second logic cell being adjacent to each other in a first direction on the substrate,
each of the first logic cell and the second logic cell including a first boundary, a second boundary, a third boundary, and a fourth boundary, the first boundary and the second boundary being opposite to each other in a second direction that intersects the first direction, and the third boundary and the fourth boundary being opposite to each other in the first direction,
the first active region and the second active region being spaced apart from each other in the first direction, the first active region being one of a PMOSFET region and an NMOSFET region, and the second active region being an other of the PMOSFET region and the NMOSFET region;
a device isolation layer on the substrate, the device isolation layer defining a first active pattern on the first active region and a second active pattern on the second active region, the first active pattern and the second active pattern extending in the second direction, and an upper portion of the first active pattern and an upper portion of the second active pattern protruding upwardly from the device isolation layer;

a first gate electrode that runs across the first active pattern and the second active pattern on the first logic cell and extends in the first direction;

a second gate electrode that runs across the first active pattern and the second active pattern on the second logic cell, the first gate electrode and the second gate electrode being aligned with each other in the first direction;

a gate cutting pattern between the first gate electrode and the second gate electrode;

a first source/drain pattern and a second source/drain pattern on the upper portion of the first active pattern and the upper portion of the second active pattern, respectively;

a separation structure on at least one of the first boundary and the second boundary;

a gate spacer on at least one sidewall of the first gate electrode and at least one sidewall of the second gate electrode;

a gate capping pattern on a top surface of the first gate electrode and a top surface of the second gate electrode;

an interlayer dielectric layer on the gate capping pattern;

an active contact that penetrates the interlayer dielectric layer and couples to at least one of the first source/drain pattern and the second source/drain pattern;

a silicide pattern between the active contact and each of the first source/drain pattern and the second source/drain pattern;

a gate contact that penetrates the interlayer dielectric layer and the gate capping pattern, the gate contact being coupled to at least one of the first gate electrode and the second gate electrode;

a first metal layer on the interlayer dielectric layer, the first metal layer including a power line on one of the third boundary and the fourth boundary, the power line extending in the second direction and having an electrical connection with the active contact; and a second metal layer on the first metal layer, wherein the active contact extends from the first active region on the first logic cell toward the first active region on the second logic cell, wherein an upper portion of the active contact includes a first upper dielectric pattern on the first active region on the first logic cell and a second upper dielectric pattern on the first active region on the second logic cell, wherein a minimum width at a portion of the active contact is a first width, the portion of the active contact being between the first upper dielectric pattern and the second upper dielectric pattern, wherein a minimum width of the gate cutting pattern is a second width, and wherein a ratio of the first width to the second width is in a range of about 0.8 to about 1.2.

17. The semiconductor device of claim 16, wherein the power line vertically overlaps the gate cutting pattern.

18. The semiconductor device of claim 16, wherein the active contact includes a first body on the first logic cell, a second body on the second logic cell, and a protrusion between the first body and the second body, the protrusion is on the device isolation layer between the first logic cell and the second logic cell, and the protrusion protrudes in a direction toward the device isolation layer.

19. The semiconductor device of claim 18, wherein the first upper dielectric pattern and the second upper dielectric pattern are horizontally offset from the protrusion.

20. The semiconductor device of claim 16, wherein the gate cutting pattern includes a first gate cutting pattern and a second gate cutting pattern that are spaced apart from each other in the first direction.

* * * * *